(12) United States Patent
Mihara

(10) Patent No.: US 10,229,998 B2
(45) Date of Patent: Mar. 12, 2019

(54) SEMICONDUCTOR DEVICE AND METHOD OF MANUFACTURING THE SAME

(71) Applicant: Renesas Electronics Corporation, Tokyo (JP)

(72) Inventor: Tatsuyoshi Mihara, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 15/914,837

(22) Filed: Mar. 7, 2018

(65) Prior Publication Data

US 2018/0337281 A1 Nov. 22, 2018

(30) Foreign Application Priority Data

May 18, 2017 (JP) .................. 2017-098614

(51) Int. Cl.
| | |
|---|---|
| *H01L 29/78* | (2006.01) |
| *H01L 29/66* | (2006.01) |
| *H01L 29/423* | (2006.01) |
| *H01L 29/51* | (2006.01) |
| *H01L 21/3105* | (2006.01) |
| *H01L 21/762* | (2006.01) |
| *H01L 21/28* | (2006.01) |
| *H01L 21/02* | (2006.01) |
| *H01L 27/11524* | (2017.01) |

(52) U.S. Cl.
CPC .... *H01L 29/7851* (2013.01); *H01L 21/02164* (2013.01); *H01L 21/28273* (2013.01); *H01L 21/31055* (2013.01); *H01L 21/76224* (2013.01); *H01L 27/11524* (2013.01); *H01L 29/4234* (2013.01); *H01L 29/42324* (2013.01); *H01L 29/42344* (2013.01); *H01L 29/513* (2013.01); *H01L 29/66795* (2013.01); *H01L 29/7855* (2013.01); *H01L 29/7856* (2013.01)

(58) Field of Classification Search
None
See application file for complete search history.

(56) References Cited

U.S. PATENT DOCUMENTS

| | | | |
|---|---|---|---|
| 8,470,714 B1 * | 6/2013 | Tsai | H01L 29/7854 438/699 |
| 8,642,409 B2 | 2/2014 | Nakazawa | |
| 2013/0049161 A1 * | 2/2013 | Piper | H01L 21/76232 257/506 |
| 2017/0062445 A1 * | 3/2017 | Yamashita | H01L 27/11521 |
| 2017/0084625 A1 * | 3/2017 | Takeuchi | H01L 29/7851 |

FOREIGN PATENT DOCUMENTS

JP 2013-042067 A 2/2013

* cited by examiner

*Primary Examiner* — Asok K Sarkar
*Assistant Examiner* — Grant Withers
(74) *Attorney, Agent, or Firm* — McGinn I. P. Law Group, PLLC

(57) ABSTRACT

Variations in height of a top of an element isolation region, which is embedded in a trench surrounding the periphery of a fin having a channel region of a split-gate MONOS memory, are suppressed to improve reliability of a semiconductor device. An element isolation region embedded in a trench between a plurality of fins, which are part of a semiconductor substrate in a memory cell region and protrude above the semiconductor substrate, is comprised of an insulating film covering the bottom of the trench and a silicon nitride film covering the top of the insulating film.

6 Claims, 29 Drawing Sheets

FIG. 29

| | OPERATION METHOD WRITE/ERASE | WRITE OPERATION VOLTAGE (V) Vmg/Vs/Vcg/Vd/Vb | ERASE OPERATION VOLTAGE (V) Vmg/Vs/Vcg/Vd/Vb | READ OPERATION VOLTAGE (V) Vmg/Vs/Vcg/Vd/Vb |
|---|---|---|---|---|
| A | SSI (WRITE)/ BTBT (ERASE) | 10/5/1/0.5/0 | -6/6/0/open/0 | 0/0/1.5/1.5/0 |
| B | SSI (WRITE)/ FN (ERASE) | 10/5/1/0.5/0 | 12/0/0/0/0 | 0/0/1.5/1.5/0 |

SEMICONDUCTOR DEVICE AND METHOD OF MANUFACTURING THE SAME

CROSS-REFERENCE TO RELATED APPLICATIONS

The disclosure of Japanese Patent Application No. 2017-098614 filed on May 18, 2017 including the specification, drawings and abstract is incorporated herein by reference in its entirety.

BACKGROUND

The present invention relates to a semiconductor device and a method of manufacturing the semiconductor device. Specifically, the invention relates to a technique effectively applied to a semiconductor device including a fin field effect transistor.

A fin field effect transistor is known as a field effect transistor capable of reducing leakage current and power consumption and being fined while operating at high speed. The fin field effect transistor (FINFET) is, for example, a semiconductor element that has a channel layer including a pattern of a semiconductor layer formed over a substrate, and has a gate electrode formed so as to straddle the pattern.

The electrically erasable and programmable read only memory (EEPROM) is widely used as an electrically writable and erasable, nonvolatile semiconductor memory device. Such a memory device typified by a currently widely used flash memory has a conductive floating gate electrode surrounded by an oxide film or a trapping insulating film below a gate electrode of a MISFET, uses a charge storage state in the floating gate or the trapping insulating film as memory information, and reads the charge storage state as a threshold of the transistor. The trapping insulating film refers to a charge-storable insulating film, and includes, for example, a silicon nitride film. Electric charges are injected or emitted into/from such a charge storage region to shift the threshold of the MISFET that is thus allowed to operate as a memory element. Such a flash memory includes a split gate cell using a metal-oxide-nitride-oxide-semiconductor (MONOS) film.

Japanese Unexamined Patent Application Publication No. 2013-42067 describes a formation process of a fin field effect transistor, in which a silicon oxide film (liner film) is formed in a trench between fins, and then a polysilazane (PSZ) film is formed by application in the trench, and the PSZ film is successively nitrided and oxidized to form a SiON film, so that the element isolation region is formed by the SiON film and the silicon oxide film.

SUMMARY

When a MONOS memory cell is formed by the FINFET, a position of a top of an element isolation region around a fin tends to vary in a processing step and a cleaning step in a manufacturing process of the memory cell. The variations in the position of the top of the element isolation region makes it difficult to process a gate electrode and the like configuring the memory cell, and easily causes insufficient filling with an interlayer insulating film over the element isolation region.

Other objects and novel features will be clarified from the description of this specification and the accompanying drawings.

A typical embodiment disclosed in the present application is briefly summarized as follows.

In a semiconductor device of one embodiment, an element isolation region embedded in a trench around a fin having a FINFET configuring a MONOS memory cell is configured by a silicon oxide film and a silicon nitride film stacked in order from a bottom side of the trench.

According to one embodiment disclosed in the present application, reliability of a semiconductor device can be improved.

BRIEF DESCRIPTION OF THE DRAWINGS

FIG. 29 is a table for explaining operating voltage of a split-gate memory cell.

DETAILED DESCRIPTION

Figure 1:
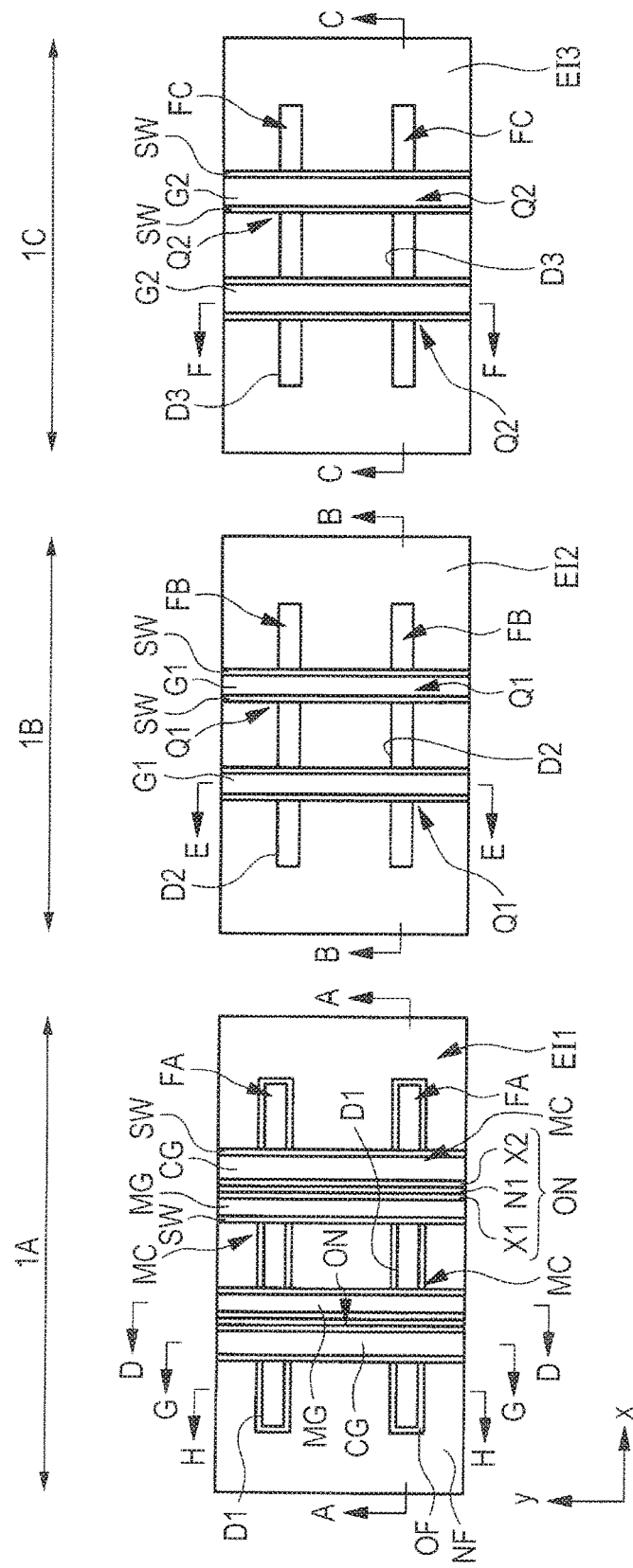
FIG. 1 is a plan view illustrating a semiconductor device of one embodiment of the invention.

Although each of the following embodiments may be dividedly described in a plurality of sections or embodiments for convenience as necessary, they are not unrelated to one another except for the particularly defined case, and are in a relationship where one is a modification, details, supplementary explanation, or the like of part or all of another one. In each of the following embodiments, when the number of elements and the like (including the number, a numerical value, amount, and a range) is mentioned, the number is not limited to a specified number except for the particularly defined case and for the case where the number is principally clearly limited to the mentioned number. In other words, the number may be not less than or not more than the mentioned number.

Furthermore, it will be appreciated that in each of the following embodiments, a component (including an element step etc.) of the embodiment is not necessarily indispensable except for the particularly defined case and for the case where the component is considered to be indispensable in principle. Similarly, in the following embodiment, when a shape or a positional relationship of a component or the like is described, any configuration substantially closely related to or similar to such a shape or the like should be included except for the particularly defined case and for the case where such a configuration is considered to be not included in principle. The same holds true for each of the numerical value and the range.

Hereinafter, one embodiment will be described in detail with reference to the accompanying drawings. In all drawings for explaining the one embodiment, components having the same function are designated by the same reference numeral, and duplicated description is omitted. In the following embodiment, the same or similar portion is not repeatedly described in principle except for a particularly required case.

Structure of Semiconductor Device

Figure 2:
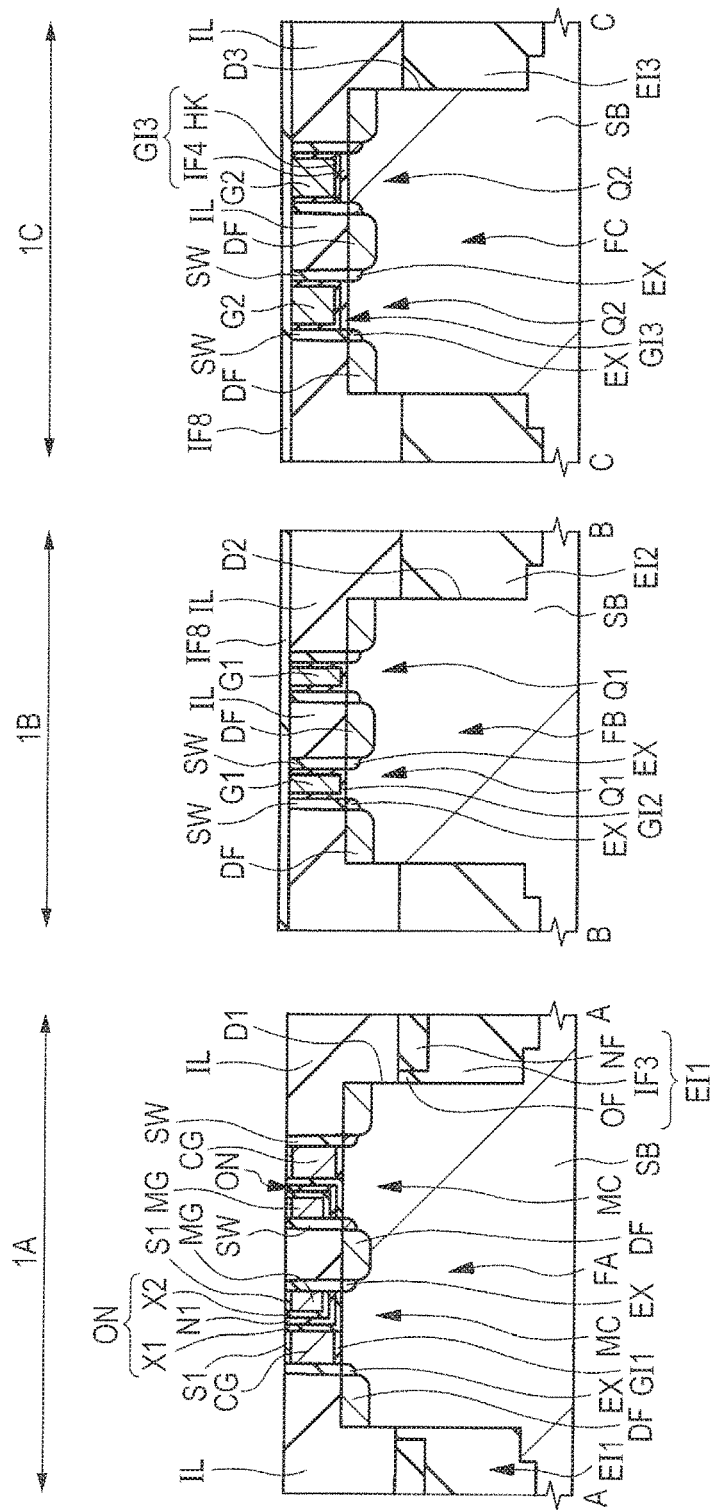
FIG. 2 includes sectional views along a line A-A, a line B-B, and a line C-C in FIG. 1 illustrating the semiconductor device of the one embodiment of the invention.
Figure 3:
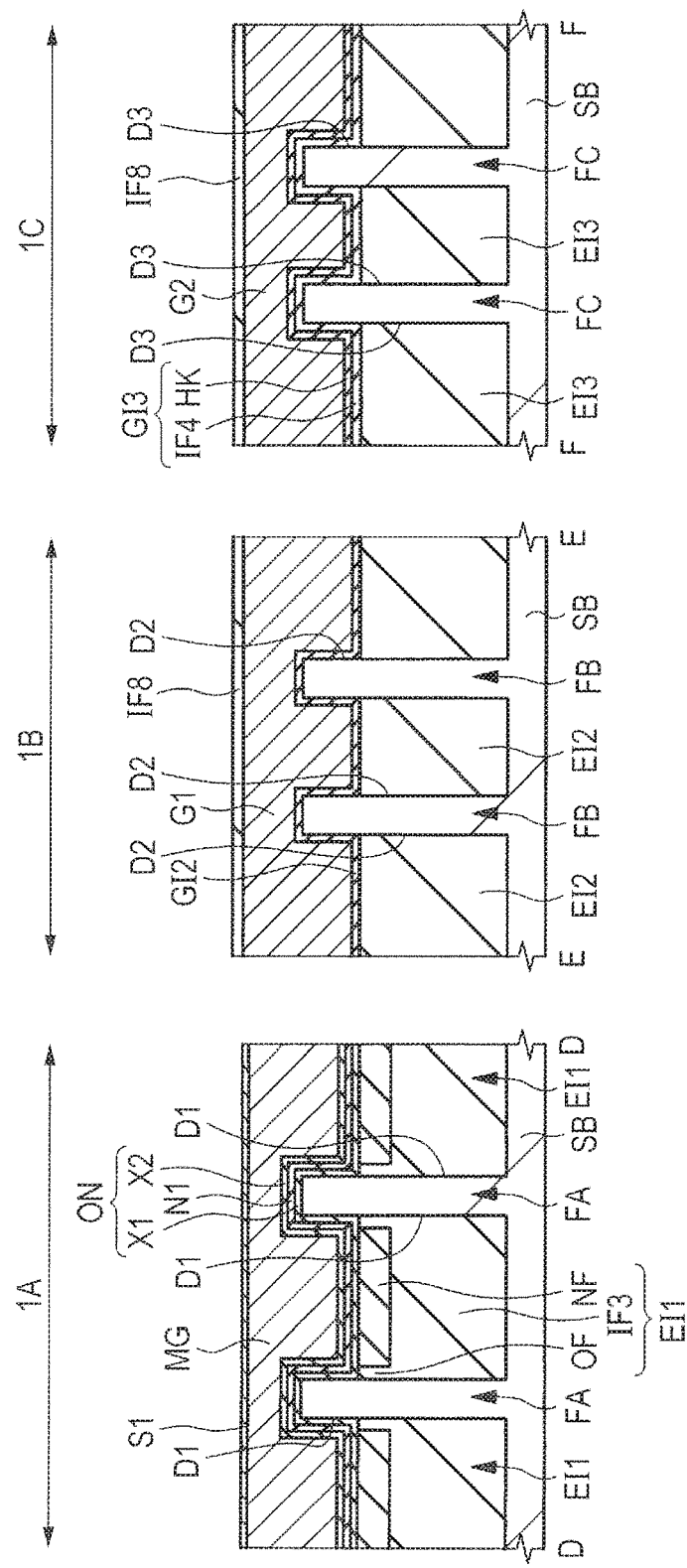
FIG. 3 includes sectional views along a line D-D, a line E-E, and a line F-F in FIG. 1 illustrating the semiconductor device of the one embodiment of the invention.
Figure 4:
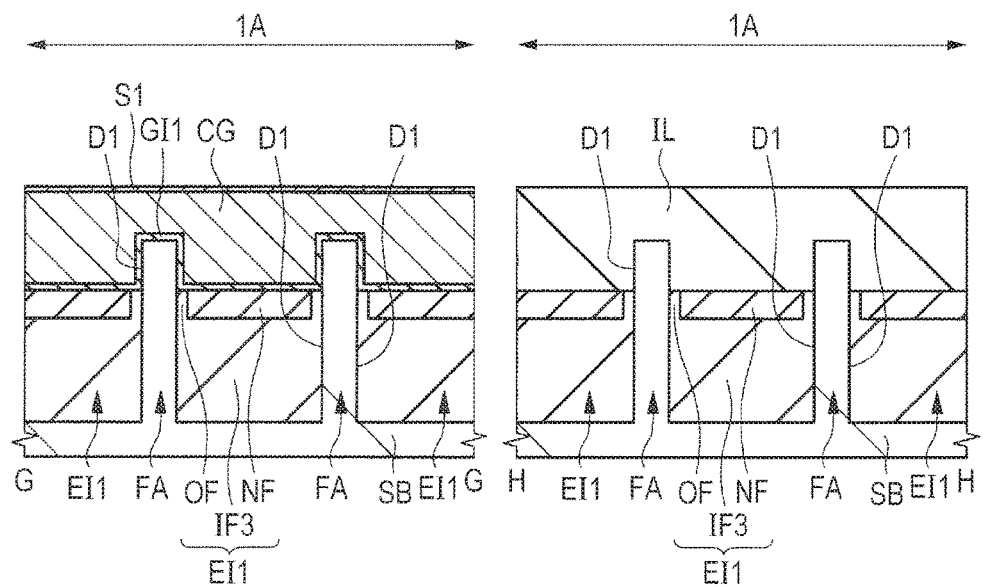
FIG. 4 includes sectional views along a line G-G and a line H-H in FIG. 1 illustrating the semiconductor device of the one embodiment of the invention.
Figure 5:
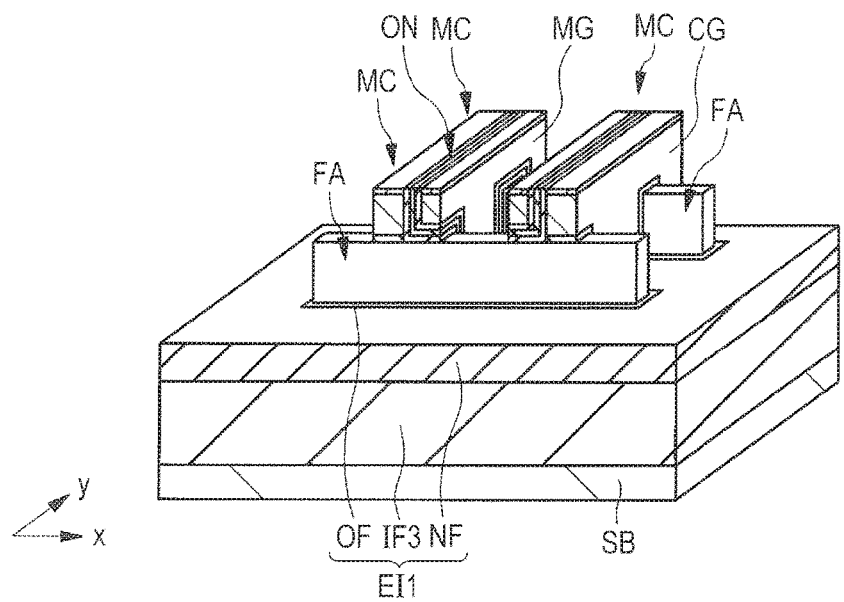
FIG. 5 is a perspective view illustrating the semiconductor device of the one embodiment of the invention.

Hereinafter, a structure of a semiconductor device of this embodiment is described with reference to FIGS. 1 to 5. FIG. 1 includes plan views illustrating a semiconductor device of this embodiment. FIGS. 2 to 4 each include sectional views illustrating the semiconductor device of this embodiment. FIG. 5 is a perspective view illustrating a memory cell configuring the semiconductor device of this embodiment.

FIG. 2 illustrates sectional views along a line A-A, a line B-B, and a line C-C of FIG. 1. FIG. 3 illustrates sectional views along a line D-D, a line E-E, and a line F-F in FIG. 1. FIG. 4 illustrates sectional views along a line G-G and a line H-H in FIG. 1. FIG. 2 shows cross sections along an extending direction of a fin as an upper part of a semiconductor substrate and along a gate length direction of a transistor. FIGS. 3 and 4 each show cross sections along an extending direction of a gate electrode over the fin. In FIGS. 1 and 5, a source-and-drain region and interlayer insulating films are omitted. In FIG. 1, a silicide layer on each gate electrode is omitted. In FIG. 5, only a memory cell region 1A is shown, and a sidewall is omitted.

In the semiconductor device of this embodiment, a split-gate memory cell including two FINFETs (a control transistor and a memory transistor), a low-withstand-voltage n-type FINFET, and a high-withstand-voltage n-type transistor are mounted on the same semiconductor substrate. Although each transistor is formed as an n-type transistor in the case described herein, the following transistors may each be a p-type transistor. When the p-type transistor is formed, the conductivity type of an impurity introduced into each region configuring a transistor as described below should be changed to a different conductivity type.

As shown in FIGS. 1 to 4, the memory cell is disposed in a memory cell region 1A, the low-withstand-voltage FINFET is disposed in a logic region 1B, and the high-withstand-voltage FINFET is disposed in an I/O region 1C. The memory cell region 1A, the logic region 1B, and the I/O region 1C do not overlap one another in planar view.

The memory cell region 1A has a plurality of split gate memory cells (nonvolatile memory elements) arranged in an array. The logic region 1B has the low-withstand-voltage FINFET configuring a periphery circuit (logic circuit). The I/O region 1C has, for example, a circuit for input and output of power between a semiconductor chip as the semiconductor device and an external component, and has the high-withstand-voltage transistor configuring that circuit. The high-withstand-voltage transistor formed in the I/O region 1C configures a circuit used for applying a relatively high voltage to the memory cell. The low-withstand-voltage transistor requires a higher operation speed than the high-withstand-voltage transistor, and operates at a lower voltage.

Any transistor mentioned in this application is a metal insulator semiconductor field effect transistor (MISFET), i.e., a MIS field effect transistor, and is a fin transistor (FINFET) using a surface of the fin as a channel region.

As shown in the memory cell region 1A in FIGS. 1 to 4, the memory cell (nonvolatile memory element) MC is formed over a plate-like fin FA that is a part of a semiconductor substrate SB and formed in the upper part of the semiconductor substrate SB. As shown in the logic region 1B in FIGS. 1 to 3, a transistor Q1 as the low-withstand-voltage FINFET is formed over a plate-like fin FB that is a part of the semiconductor substrate SB and formed in the upper part of the semiconductor substrate SB. As shown in the I/O region 1C in FIGS. 1 to 3, a transistor Q2 as the high-withstand-voltage FINFET is formed over a plate-like fin FC that is a part of the semiconductor substrate SB and formed in the upper part of the semiconductor substrate SB.

The section D-D of the memory cell region 1A shown in FIG. 3 includes a memory gate electrode MG and an ONO film ON of the memory cell MC. The section G-G of the memory cell region 1A shown in FIG. 4 includes a control gate electrode CG of the memory cell MC. The section H-H of the memory cell region 1A shown in FIG. 4 includes a source-and-drain region of the memory cell MC. However, the source-and-drain region is omitted in the section H-H of FIG. 4.

Each of the fins FA, FB, and FC is a pattern of a semiconductor layer extending along an x direction (see FIG. 1) along the main surface of the semiconductor substrate SB, and a width of each of the fins FA, FB, and FC in a y direction (see FIG. 1), which is orthogonal to the x direction and along the main surface of the semiconductor substrate SB, is extremely small compared with a width of each of the fins FA, FB, and FC in the x direction. The semiconductor substrate SB includes, for example, single-crystal silicon.

The respective fins FA, fins FB, and fins FC are arranged side by side in the y direction. Although only two fins FA arranged in the y direction are shown in FIGS. 1, 3, and 4, a larger number of fins FA may be arranged in the y direction. The same holds true for each of the fins FB and FC shown in FIG. 1. In the memory cell region 1A, while not shown, a plurality of fins FA may also be arranged in the x direction, and each fin FA may have any shape as long as the fin is a protrusion having a length, a width, and a height. For example, a meandering pattern in planar view is also included. In addition, the fins FA may be arranged in any way. The respective fins FB and FC in the logic region 1B and the I/O region 1C are also arranged in the same way.

In the memory cell region 1A in FIG. 1, although two memory cells MC are arranged in the x direction over one fin FA, a larger number of memory cells MC are actually arranged in the x direction over one fin FA. The same holds true for each of the transistor Q1 over the fin FB and the transistor Q2 over the fin FC.

A trench D1 is provided in the top of the semiconductor substrate SB between the fins FA. A trench D2 is provided in the top of the semiconductor substrate SB between the fins FB. A trench D3 is provided in the top of the semiconductor substrate SB between the fins FC. A side surface of the fin FA configures a side surface of the trench D1. A side surface of the fin FB configures a side surface of the trench D2. A side surface of the fin FC configures a side surface of the trench D3.

As shown in FIGS. 2 and 3, an element isolation region (element isolation part) EI1 includes an insulating film filling the trench D1. However, the element isolation region EI1 does not completely fill the trench D1, and part of the fin FA projects above the top of the element isolation region EI1. The element isolation region EI1 is configured by an insulating film IF3 embedded in the trench D1, a silicon nitride film NF as an insulating film embedded in the trench D1 on the insulating film IF3, and an insulating film OF interposed between the silicon nitride film NF and the fin FA. Each of the insulating films IF3 and OF includes, for example, a silicon oxide film. Each of the bottoms of the insulating film OF and the silicon nitride film NF is in contact with the top of the insulating film IF3, and the tops of the silicon nitride film NF and the insulating film OF are roughly flush with each other.

The top of the element isolation region EI1 is almost entirely configured by the top of the silicon nitride film NF in a direction along the main surface of the semiconductor substrate SB. In other words, a width of the top of the silicon nitride film NF in that direction is extremely larger than a width of the top of the insulating film OF in the direction. That is, the top of the element isolation region EI1 includes the top of the silicon nitride film NF and the top of the insulating film OF, and area of the top of the silicon nitride film NF is larger than area of the top of the insulating film OF. In FIGS. 1 to 4, the insulating film OF and the insulating film IF are shown as one film, i.e., the boundary between insulating films OF and IF is omitted.

An element isolation region EI2 includes an insulating film filling the trench D2. However, the element isolation region EI2 does not completely fill the trench D2, and part of the fin FB projects above the top of the element isolation region EI2. The element isolation region EI2 includes, for example, a silicon oxide film. An element isolation region EI3 includes an insulating film filling the trench D3. However, the element isolation region EI3 does not completely fill the trench D3, and a part of the fin FC projects above the top of the element isolation region EI3. The element isolation region EI3 includes, for example, a silicon oxide film. Each of the element isolation regions EI1, EI2, and EI3 has a shallow trench isolation (STI) structure.

A pattern, referred to as fin FA in this application, configures part of the semiconductor substrate SB in the memory cell region 1A, and includes an upper-layer pattern exposed from the element isolation region EI1 and extending in the x direction, and a lower-layer pattern running from an upper-layer pattern side to the bottom of the trench D1 directly below the upper-layer pattern. Similarly, a pattern referred to as fin FB configures part of the semiconductor substrate SB in the logic region 1B, and includes an upper-layer pattern exposed from the element isolation region EI2 and extending in the x direction, and a lower-layer pattern running from an upper-layer pattern side to the bottom of the trench D2 directly below the upper-layer pattern. Similarly, a pattern referred to as fin FC configures part of the semiconductor substrate SB in the I/O region 1C, and includes an upper-layer pattern exposed from the element isolation region EI3 and extending in the x direction and a lower-layer pattern running from an upper-layer pattern side to the bottom of the trench D3 directly below the upper-layer pattern.

That is, the fin is a semiconductor pattern that protrudes from the top of the semiconductor substrate, which corresponds to the bottom of each trench, to the upper side of the semiconductor substrate, for example, a protrusion extending in the x direction of FIG. 1. While not shown, a p-type well containing a p-type impurity (for example, boron (B)) is formed deep compared with the source-and-drain region as described later in the top of each of the fins FA, FB, and FC.

As shown in FIGS. 1 to 5, a control gate electrode CG extending in the y direction and a memory gate electrode MG extending in the y direction are provided directly over the fins FA arranged in the y direction so as to straddle the fins FA. The control gate electrode CG and the memory gate electrode MG each also extend directly over the element isolation region EI1 between the fins FA arranged in the y direction.

As shown in FIGS. 2 and 4, the control gate electrode CG is provided over the fins FA with the gate insulating film GI1 in between. As shown in FIG. 4, the control gate electrode CG is provided over side surfaces of each fin FA above the element isolation region EI1 with the gate insulating film GI1 in between. The gate insulating film GI1 in the memory cell region 1A covers the top and the side surfaces of the fin FA exposed from the element isolation region EI1, and includes, for example, a silicon oxide film. The control gate electrode CG includes, for example, a polysilicon film.

As shown in FIGS. 1 and 2, one side surface in the x direction of the control gate electrode CG is covered with a sidewall SW, and the other side surface has thereon the memory gate electrode MG with an oxide-nitride-oxide (ONO) film ON in between. The ONO film ON is a stacked film, in which a silicon oxide film X1, a silicon nitride film N1, and a silicon oxide film X2 are stacked in order from a semiconductor substrate SB side and from a control gate electrode CG side. The memory gate electrode MG includes, for example, a polysilicon film. The silicon nitride film N1 is a trapping insulating film (a charge storage film, a charge holding film). A charge storage state of the silicon nitride film N1 is varied through operation of the memory cell MC, thereby the threshold voltage of the memory cell MC can be varied.

As shown in FIGS. 2, 3, and 5, the memory gate electrode MG is provided over the fins FA with the ONO film ON in between. That is, the ONO film ON is continuously formed along the top of the fin FA and the side surface of the control gate electrode CG, i.e., has an L-shaped section. The memory gate electrode MG is thus isolated from the control gate electrode CG and the fin FA by the ONO film.

As shown in FIG. 2, one side surface in the x direction of the memory gate electrode MG is not in contact with the ONO film ON and is covered with the sidewall SW. The sidewall SW includes, for example, a silicon nitride film, a silicon oxide film, or a stacked film thereof. A silicide layer S1 is provided on the top of each of the control gate electrode CG and the memory gate electrode MG. The silicide layer S1 includes, for example, nickel silicide (NiSi) or cobalt silicide (CoSi). The silicide layer S1 is provided to reduce a coupling resistance between an undepicted contact plug, which is to be coupled to each of the tops of the control gate electrode CG and the memory gate electrode MG, and the control gate electrode CG or the memory gate electrode MG.

An insulating film IF8 is provided on each of the interlayer insulating film IL, the gate electrode G1, the gate electrode G2, and the sidewall SW in each of the logic region 1B and the I/O region 1C. The insulating film IF8 includes, for example, a silicon oxide film.

A pair of patterns, which each include the control gate electrode CG and the memory gate electrode MG adjacent to each other with the ONO film ON in between, are arranged in the x direction directly over the fins FA in the memory cell region 1A. The pair of patterns are separate from each other, and the memory gate electrode MG is adjacent to each of the opposed surfaces of the two control gate electrodes CG configuring the pair of patterns.

A pair of source-and-drain regions are provided in the top of the fin FA on both lateral sides of the pattern in the x direction. Each source-and-drain region is configured by two n-type semiconductor regions containing an introduced n-type impurity ((for example, phosphorus (P) or arsenic (As)), i.e., an extension region EX and a diffusion layer DF. The extension region EX has a lower concentration of the n-type impurity than the diffusion layer DF. The diffusion layer DF is formed deep compared with the extension region EX. The extension region EX is disposed at a position close to the top of the fin FA directly below each of the control gate electrode CG and the memory gate electrode MG compared with the adjacent diffusion layer DF. Thus, the source-and-drain region has a lightly doped drain (LDD) structure including the extension region EX having a low impurity concentration and the diffusion layer DF having a high impurity concentration.

The control gate electrode CG and the pair of source-and-drain regions formed in the top of the fin FA on both sides of that control gate electrode CG configure a first transistor (control transistor) of the MISFET structure. The memory gate electrode MG and the pair of source-and-drain regions formed in the top of the fin FA on both sides of that memory gate electrode MG configure a second transistor (memory transistor) of the MISFET structure. One memory cell MC of this embodiment is configured by the first and second transistors sharing the source-and-drain region. That is, the memory cell MC includes the control gate electrode CG, the memory gate electrode MG, the ONO film, the drain region in the vicinity of the control gate electrode CG, and the source region in the vicinity of the memory gate electrode MG.

Two memory cells MC are provided on one fin FA. The two memory cells MC share the source region. The top and the side surfaces of the fin FA covered with the control gate electrode CG and the memory gate electrode MG include a channel region in which a channel is formed during operation of the memory cell MC. The memory cell MC is a nonvolatile memory that is electrically rewritable for each of write operation and erase operation. The memory cell MC of this embodiment including the control gate electrode CG and the memory gate electrode MG adjacent to each other and the ONO film ON is a split-gate metal oxide nitride oxide semiconductor (MONOS) memory.

As shown in FIGS. 1 to 3, in the logic region 1B, gate electrodes G1 extending in the y direction are provided directly over the fins FB arranged in the y direction so as to straddle the fins FB. As shown in FIGS. 2 and 3, each gate electrode G1 is provided over the fins FB and the element isolation regions EI2 with a gate insulating film GI2 in between. As shown in FIG. 3, the gate electrode G1 is provided over side surfaces of the fin FB above the element isolation region EI2 with the gate insulating film GI2 in between. The gate insulating film GI2 covers the top and the side surfaces of the fin FB exposed from the element isolation region EI2.

As shown in FIG. 2, the gate insulating film GI2 continuously covers the bottom and the side surfaces on both sides of the gate electrode G1. That is, any surface other than the top of the gate electrode G1 is surrounded by the gate insulating film GI2. While not shown, for example, a silicon oxide film may be formed as part of the gate insulating film between the gate insulating film GI2 and the fin FB. A metal oxide film such as, for example, a hafnium oxide film, a zirconium oxide film, an aluminum oxide film, a tantalum oxide film, or a lanthanum oxide film may be used as the gate insulating film GI2. The gate insulating film GI2 is what is called a high-k film having a dielectric constant higher than that of the silicon oxide film.

The gate electrode G1 includes, for example, an aluminum (Al) film. The gate electrode G1 may also have a stacked structure including a titanium-aluminum (TiAl) film and an aluminum (Al) film stacked in order on the semiconductor substrate SB, for example. That is, the gate electrode G1 is a metal gate electrode.

As shown in FIGS. 1 and 2, the side surfaces on both sides of the gate electrode G1 are each covered with the sidewall SW. No silicide layer S1 is formed on the top of the gate electrode G1. When the gate electrode G1 is coupled to an overlaid contact plug (not shown), since the gate electrode G1 including the metal film has a lower resistance than the silicon film, the gate electrode G1 can be ohmically coupled to the contact plug without the silicide layer S1. A pair of gate electrodes G1 are arranged in the x direction directly over the fin FB in the logic region 1B. The pair of gate electrodes G1 are separate from each other.

A pair of source-and-drain regions are provided in the top of the fin FB on both lateral sides in the x direction of the gate electrodes G1. As with the source-and-drain region in the memory cell region 1A, each source-and-drain region is configured by two n-type semiconductor regions containing an introduced n-type impurity ((for example, phosphorus (P) or arsenic (As)), i.e., an extension region EX and a diffusion layer DF. The source-and-drain region in the memory cell region 1A has a higher impurity concentration than the source-and-drain region in the logic region 1B.

The gate electrode G1 and the pair of source-and-drain regions formed in the top of the fin FB on both sides of that gate electrode G1 configure a low-withstand-voltage transistor Q1 having a MISFET structure. Two transistors Q1 are provided on one fin FB. The top of the fin FB directly below the gate electrode G1 includes a channel region in which a channel is formed during operation of the transistors Q1. The two transistors Q1 share one of the pair of source-and-drain regions.

As shown in FIGS. 1 to 3, in the I/O region 1C, gate electrodes G2 extending in the y direction are provided directly over the fins FC arranged in the y direction so as to straddle the fins FC. As shown in FIGS. 2 and 3, each gate electrode G2 is provided over the fins FC and the element isolation regions EI3 with a gate insulating film GI3 in between. As shown in FIG. 3, the gate electrode G2 is provided over the side surfaces of the fin FC above the element isolation region EI3 with the gate insulating film GI3 in between. The gate insulating film GI3 covers the top and the side surfaces of the fin FC exposed from the element isolation region EI3, and the top of the element isolation region EI3.

As shown in FIG. 2, the gate insulating film GI3 continuously covers the bottom and the side surfaces on both sides of the gate electrode G2. That is, any surface other than the top of the gate electrode G2 is surrounded by the gate insulating film GI3. The gate insulating film GI3 is a stacked film including a high-k film HK continuously covering the bottom and the side surfaces on both sides of the gate electrode G2, and an insulating film IF4 interposed between the bottom of the high-k film HK and the fin FC. The insulating film IF4 includes, for example, a silicon oxide film, and has a thickness larger than a thickness of each of the gate insulating films GI1 and GI2. A metal oxide film such as, for example, a hafnium oxide film, a zirconium oxide film, an aluminum oxide film, a tantalum oxide film, or a lanthanum oxide film may be used as the high-k film HK. The high-k film HK has a higher dielectric constant than the silicon oxide film.

The gate electrode G2 includes, for example, an aluminum (Al) film. The gate electrode G2 may also have a stacked structure including a titanium-aluminum (TiAl) film and an aluminum (Al) film stacked in order on the semiconductor substrate SB, for example. That is, the gate electrode G2 is a metal gate electrode.

As shown in FIGS. 1 and 2, the side surfaces of the gate electrode G2 are each covered with the sidewall SW. No silicide layer S1 is provided on the top of the gate electrode G2. A pair of gate electrodes G2 are arranged in the x direction directly over the fin FC in the I/O region 1C. The pair of gate electrodes G2 are separate from each other. The gate length of the gate electrode G2 is longer than the gate length of the gate electrode G1.

A pair of source-and-drain regions are provided in the top of the fin FC on both lateral sides in the x direction of the gate electrodes G2. As with the source-and-drain region in the memory cell region 1A, each source-and-drain region is configured by two n-type semiconductor regions containing an introduced n-type impurity ((for example, phosphorus (P) or arsenic (As)), i.e., an extension region EX and a diffusion layer DF. The source-and-drain region in the memory cell region 1A has a higher impurity concentration than the source-and-drain region in the I/O region 1C.

The gate electrode G2 and the pair of source-and-drain regions formed in the top of the fin FC on both sides of that gate electrode G2 configure a high-withstand-voltage transistor Q2 having a MISFET structure. Two transistors Q2 are provided on one fin FC. The top of the fin FC directly below the gate electrode G2 includes a channel region in which a channel is formed during operation of the transistors Q2. The two transistors Q2 share one of the pair of source-and-drain regions.

In the above-described case, the diffusion layer DF, which configures the source-and-drain region in each of the memory cell region 1A, the logic region 1B, and the I/O region 1C, is formed in the surface of each fin. However, such a diffusion layer DF may be formed in an epitaxial growth layer that is formed in contact with the surface of the fin above each of the element isolation regions EI1 to EI3.

In this application, the first and second transistors and the transistors Q1 and Q2, each of which has part of the fin FA as a channel region and is formed over the fin FA, are each referred to as FINFET. The first and second transistors each configuring the memory cell MC operates at a high voltage compared with the low-withstand-voltage transistor Q1 configuring the logic circuit, and thus require high withstand voltage performance compared with the transistor Q1.

The tops of the element isolation regions EI1 to EI3, the side surfaces of the fins FA, FB, and FC, and the side surfaces of the sidewalls SW are covered with the interlayer insulating film IL. That is, the interlayer insulating film IL is embedded in the respective insides of the trenches D1 to D3 over the element isolation regions EI1 to EI3. The interlayer insulating film IL mainly includes, for example, a silicon oxide film. While not shown, a thin insulating film (liner film) is provided between the interlayer insulating film IL and the top of each of the element isolation regions EI1 to EI3, between the interlayer insulating film IL and the side surface of each of the fins FA, FB, and FC, and between the interlayer insulating film IL and the side surface of each sidewall SW. Such a thin insulating film includes, for example, a silicon nitride film. The tops of the interlayer insulating film IL, the sidewall SW, the gate electrodes G1 and G2, the ONO film ON, the control gate electrode CG, and the memory gate electrode MG are planarized in substantially the same plane.

While not shown, the tops of the interlayer insulating film IL, the memory cell MC, and the transistors Q1 and Q2 are covered with an interlayer insulating film. While not shown, a plurality of contact plugs, which penetrate the interlayer insulating film IL and that interlayer insulating film over the interlayer insulating film IL, are provided while being electrically coupled to the gate electrodes G1 and G2, the control gate electrode CG, the memory gate electrode MG, and the source-and-drain regions. An undepicted interconnection is provided on each contact plug.

The semiconductor device of this embodiment is mainly characterized in that, in the memory cell region 1A, the top of the element isolation region EI1 surrounding the fin FA having the MONOS memory thereon is protected by the silicon nitride film NF. The silicon nitride film NF is a protective film to prevent height of the top of the element isolation region EI1 from varying.

Operation of Semiconductor Device

Operation of the semiconductor device of this embodiment, mainly operation of the nonvolatile memory, is now described with reference to FIG. 29. FIG. 29 is a table for explaining operating voltage of the split-gate memory cell.

The memory cell of this embodiment has a MISFET structure, and uses a charge storage state in the trapping insulating film in the gate electrode of the MISFET and reads the charge storage state as a threshold of a transistor. The trapping insulating film refers to a charge-storable insulating film, and includes, for example, a silicon nitride film. Electric charges are injected or emitted into/from such a charge storage region to shift the threshold of the MISFET that is thus allowed to operate as a memory cell. A nonvolatile semiconductor memory device using the trapping insulating film includes a split-gate MONOS memory such as the memory cell of this embodiment.

FIG. 29 is the table showing an example of a condition of voltage application to each part of a selected memory cell in "write", "erase", and "read". The table of FIG. 29 shows a voltage Vmg applied to the memory gate electrode MG, a voltage Vs applied to the source region, a voltage Vcg applied to the control gate electrode CG, and a voltage Vd applied to the drain region of the memory cell MC as shown in FIG. 2, and shows a voltage Vb applied to an undepicted p-type well in the top of the semiconductor substrate in each of "write", "erase", and "read". The selected memory cell described herein refers to a memory cell selected as an object for "write", "erase", or "read".

In the example of the nonvolatile memory shown in FIG. 2, a semiconductor region on a memory gate electrode MG side is the source region, and a semiconductor region on a control gate electrode CG side is the drain region. The condition shown in the table of FIG. 29 is a preferred, but not limitative, example, and can be variously modified or altered as necessary. In this embodiment, injection of electrons into the silicon nitride film N1, which is a charge storage part of the ONO film ON of the memory transistor, is defined as "write", and injection of holes into the silicon nitride film N1 is defined as "erase".

In the table of FIG. 29, a column A corresponds to a case where a write method is an SSI method and an erase method is a BTBT method, and a column B corresponds to a case where the write method is the SSI method and the erase method is an FN method.

The SSI method is considered as an operation method in which the memory cell is written by injecting hot electrons into the silicon nitride film N1 (see FIG. 2). The BTBT method is considered as an operation method in which the memory cell is erased by injecting hot holes into the silicon nitride film N1. The FN method is considered as an operation method in which write or erase is performed through tunneling of electrons or holes. To describe the FN method differently, write by the FN method is considered as an operation method, in which electrons are injected into the silicon nitride film N1 by the FN tunneling effect to perform write to the memory cell. Erase by the FN method is considered as an operation method, in which holes are injected into the silicon nitride film N1 by the FN tunneling effect to perform erase of the memory cell. The operation methods are specifically described below.

The write method includes a write method (hot-electron injection write method), in which write is performed by hot-electron injection through source side injection, what is called, a source side injection (SSI) method, and a write method (tunneling write method), in which write is performed by Fowler Nordheim (FN) injection, what is called, an FN method. In the case described in this application, write is performed by the SSI method.

In write by the SSI method, for example, a voltage shown in "write operation voltage" in the column A or B of the table of FIG. 29 (Vmg=10 V, Vs=5 V, Vcg=1 V, Vd=0.5 V, Vb=0 V) is applied to each part of a selected memory cell to be written, so that electrons are injected into the silicon nitride film N1 in the ONO film ON of the selected memory cell to perform write.

At this time, hot electrons are generated in the channel region (between the source and the drain) below between the two gate electrodes (the memory gate electrode MG and the control gate electrode CG), and the hot electrons are injected into the silicon nitride film N1 as a charge storage part in the ONO film ON below the memory gate electrode MG. The injected hot electrons (electrons) are captured by trap levels in the silicon nitride film N1 configuring the ONO film ON, resulting in an increase in threshold voltage of the memory transistor. That is, the memory transistor is turned into a write state.

The erase method includes an erase method (hot-hole injection erase method), in which erase is performed by hot-hole injection through band-to-band tunneling (BTBT), what is called, a BTBT method, and an erase method (tunneling erase method), in which erase is performed by Fowler Nordheim (FN) tunneling, what is called, an FN method.

In erase by the BTBT method, holes generated through BTBT are injected into the charge storage part (the silicon nitride film N1 in the ONO film ON) to perform erase. For example, a voltage shown in "erase operation voltage" in the column A of the table of FIG. 29 (Vmg=−6 V, Vs=6 V, Vcg=0 V, Vd=open, Vb=0 V) is applied to each part of a selected memory cell to be erased. Consequently, holes are generated by the BTBT phenomenon and accelerated by an electric field, thereby the holes are injected into the silicon nitride film N1 configuring the ONO film ON of the selected memory cell to reduce the threshold voltage of the memory transistor. That is, the memory transistor is turned into an erase state.

In erase by the FN method, a voltage shown in "erase operation voltage" in the column B of the table of FIG. 29 (Vmg=12 V, Vs=0 V, Vcg=0 V, Vd=0 V, Vb=0 V) is applied to each part of the selected memory cell to be erased, so that in the selected memory cell, holes are injected through tunneling from the memory gate electrode MG into the silicon nitride film N1 in the ONO film ON to perform erase. At this time, holes are injected from the memory gate electrode MG into the ONO film ON while tunneling through the silicon oxide film X2 by FN tunneling (FN tunneling effect), and are captured by trap levels in the silicon nitride film N1 configuring the ONO film ON, resulting in a reduction in threshold voltage of the memory transistor. That is, the memory transistor is turned into an erase state.

For read, for example, a voltage (Vmg=0 V, Vs=0 V, Vcg=1.5 V, Vd=1.5 V, Vb=0 V) shown in "read operation voltage" in the column A or B of the table of FIG. 29 is applied to each part of the selected memory cell to be read. The voltage Vmg applied to the memory gate electrode MG for read is set to an intermediate value between the threshold voltage in the write state and the threshold voltage in the erase state of the memory transistor, making it possible to distinguish between the write state and the erase state.

Method of Manufacturing Semiconductor Device

A method of manufacturing the semiconductor device of this embodiment is described with reference to FIGS. 6 to 28. FIGS. 6 to 28 are each a sectional view to explain the method of manufacturing the semiconductor device of this embodiment. FIGS. 6 to 28 each sequentially show the memory cell region 1A, the logic region 1B, and the I/O region 1C in this order from the left of the drawing. FIGS. 6 to 17 each show sections in a lateral direction of the fin to be formed, i.e., in the y direction (see FIG. 1) orthogonal to the extending direction. FIGS. 18 to 28 each show sections in the x direction (see FIG. 1) that is the extending direction of the fin to be formed.

Figure 6:
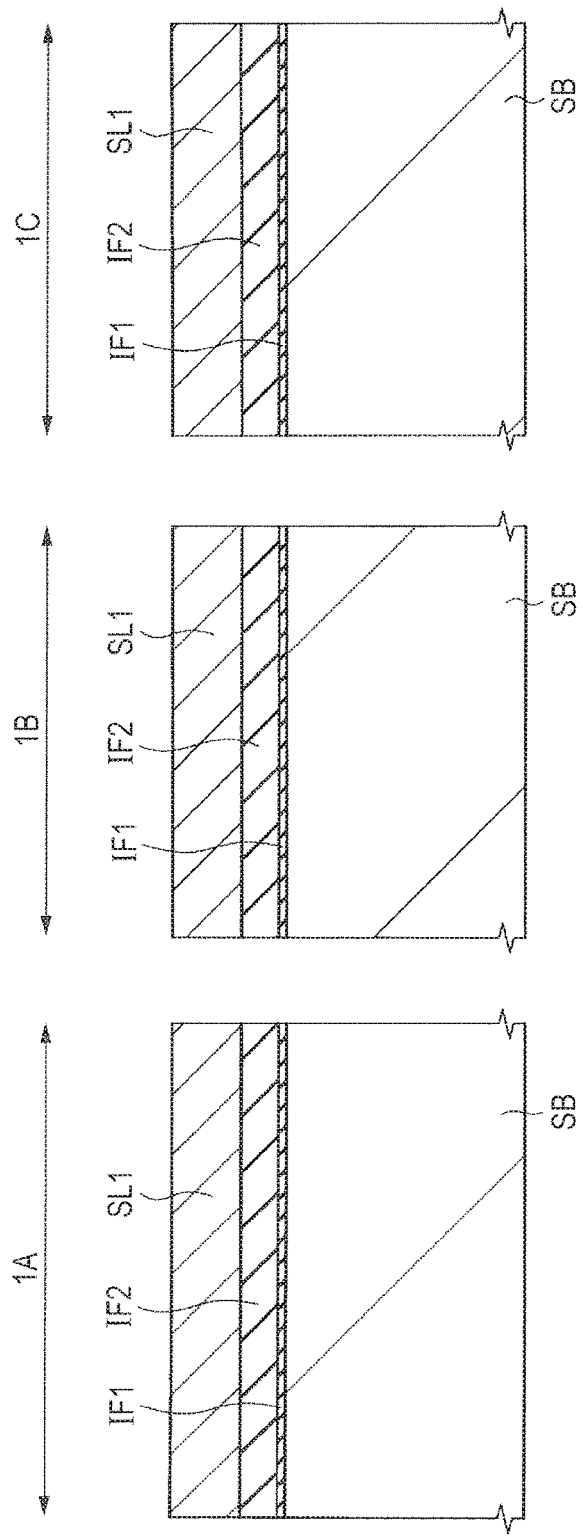
FIG. 6 includes sectional views explaining a manufacturing process of the semiconductor device of the one embodiment of the invention.

First, as shown in FIG. 6, the semiconductor substrate SB is provided, and the insulating film IF1 including a thin silicon oxide film is formed on the top of the semiconductor substrate SB by a thermal oxidation process or the like. The insulating film IF1 is a pad oxide film. Subsequently, the insulating film IF2 is formed on the insulating film IF1 using a chemical vapor deposition (CVD) process, for example. The insulating film IF2 includes, for example, a silicon nitride film. Subsequently, an amorphous silicon film SL1 is formed on the insulating film IF2 using a CVD process, for example.

Figure 7:
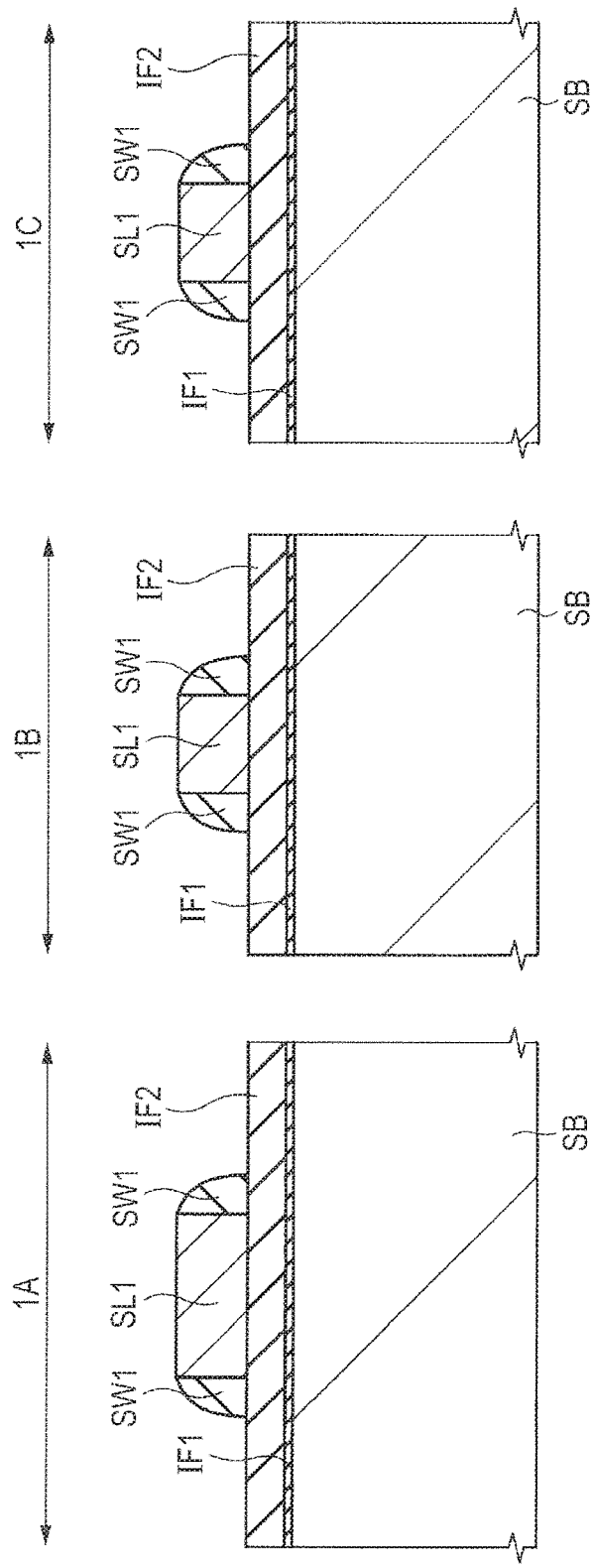
FIG. 7 includes sectional views explaining the manufacturing process of the semiconductor device following FIG. 6.

Subsequently, as shown in FIG. 7, the amorphous silicon film SL1 is patterned using a photolithography technique and a dry etching process. Such processed amorphous silicon film SL1 has a rectangular shape extending in the x direction in planar view. Although one pattern of the amorphous silicon film SL1 is shown in each of the memory cell region 1A, the logic region 1B, and the I/O region 1C in the drawing, a plurality of amorphous silicon films SL1 are disposed in a matrix in planar view in each of the memory cell region 1A, the logic region 1B, and the I/O region 1C including undepicted regions. The width in the y direction of the amorphous silicon film SL1 in the memory cell region 1A is larger than the width in the y direction of the amorphous silicon film SL1 in the logic region 1B.

Subsequently, a sidewall SW1 covering the side surfaces of the amorphous silicon film SL1 is formed. A silicon oxide film is deposited using, for example, a CVD process on the amorphous silicon film SL1 and the insulating film IF2, and then the silicon oxide film is etched back, thereby the sidewall SW1 including the silicon oxide film is formed. That is, the tops of the amorphous silicon film SL1 and the insulating film IF2 are exposed by the etchback. The sidewall SW1 has a rectangular and annular structure surrounding the amorphous silicon film SL1 in planar view.

Figure 8:
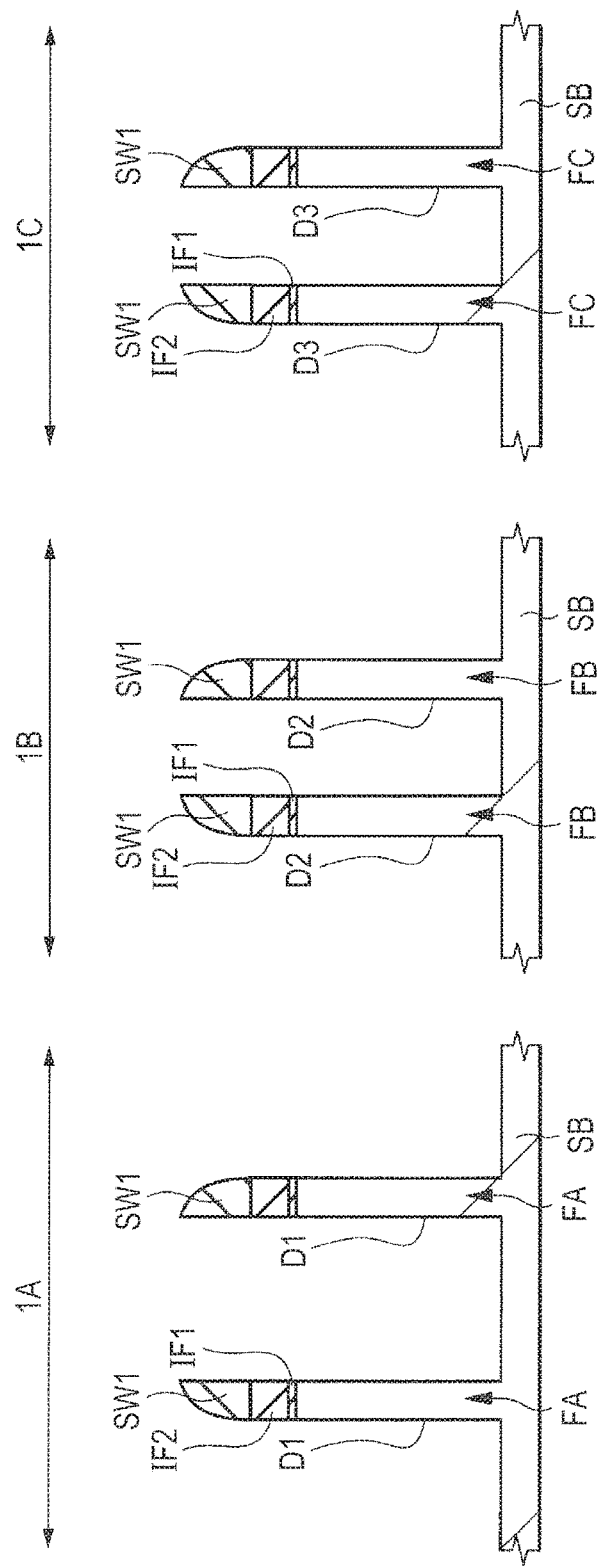
FIG. 8 includes sectional views explaining the manufacturing process of the semiconductor device following FIG. 7.

Subsequently, as shown in FIG. 8, the amorphous silicon film SL1 is removed by performing wet etching, for example. As a result, the sidewall SW1 having a rectangular frame shape in planar view remains on the insulating film IF2.

Subsequently, the insulating films IF2 and IF1 and part of the top of the semiconductor substrate SB are processed by performing dry etching with the sidewall SW1 as a mask. Consequently, the fins FA, FB, and FC are formed by a part (including the top) of the semiconductor substrate SB, and the trench D1 around the fin FA, the trench D2 around the fin FB, and the trench D3 around the fin FC are formed.

That is, the plate-like fins FA, FB, and FC protruding upward are formed in the top of the semiconductor substrate SB. The plate-like pattern as a part of the top of the semiconductor substrate SB in the memory cell region 1A includes two fins FA extending in the x direction, and has a rectangular and annular structure in planar view. The plate-like pattern as a part of the top of the semiconductor substrate SB in the logic region 1B includes two fins FB extending in the x direction, and has a rectangular and annular structure in planar view. The plate-like pattern as a part of the top of the semiconductor substrate SB in the I/O region 1C includes two fins FC extending in the x direction, and has a rectangular and annular structure in planar view. The trenches D1, D2, and D3 are each a trench formed in the top of the semiconductor substrate SB.

Although the sidewall SW1 is possibly entirely removed by dry etching in the processing step to form the trenches D1, D2, and D3, the sidewall SW1 remains in the case described herein.

Figure 9:
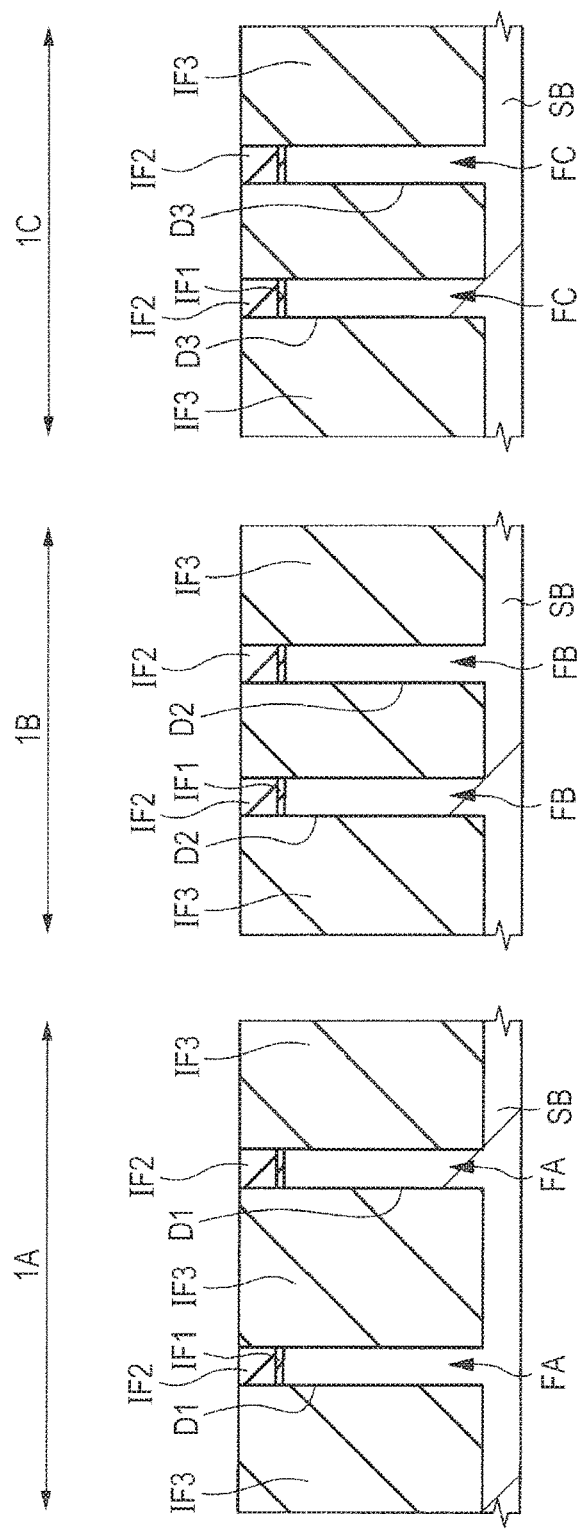
FIG. 9 includes sectional views explaining the manufacturing process of the semiconductor device following FIG. 8.

Subsequently, as shown in FIG. 9, the inside of each of the trenches D1, D2, and D3 is filled with an insulating film using a CVD process, for example. That insulating film includes, for example, a silicon oxide film. Subsequently, the insulating film and the sidewall SW1 are polished using a chemical mechanical polishing (CMP) process, for example. The sidewall SW1 is removed by such polishing. When the sidewall SW1 is entirely removed in the dry etching step as described with reference to FIG. 8, the polishing step by the CMP process may not be performed. As a result, the top of the insulating film IF2 is exposed, and the top of the insulating film IF2 and the top of the above-described insulating film, which is completely embedded in the trenches D1 to D3, are planarized.

Subsequently, some of the insulating films IF2 and IF1 exposed from the above-described insulating film and part of the plate-like pattern including the top of the semiconductor substrate SB are removed using a photolithography technique and a dry etching process. Specifically, in the memory cell region 1A, while the plate-like pattern having a rectangular and annular structure has, for example, an undepicted portion extending in the y direction, i.e., a portion that couples between the two fins FA arranged in the y direction, such a portion is processed. This results in removal of a portion of an upper part of the pattern that configures the plate-like pattern and extends in the y direction. In other words, the top of the plate-like pattern extending in the y direction is etched back. Similarly, this step also removes a portion of an upper part of a pattern, which couples between the ends of the fins FB arranged in the y direction and extends in the y direction, of the plate-like pattern in the logic region 1B. Similarly, this step also removes a portion of an upper part of a pattern, which couples between the ends of the fins FC arranged in the y direction and extends in the y direction, of the plate-like pattern in the I/O region 1C.

Subsequently, a region, from which part of the insulating film IF1 and part of the plate-like pattern are removed in the above step, is filled with an insulating film including, for example, a silicon oxide film using a CVD process or the like. Subsequently, polishing is performed using, for example, a CMP process to planarize the top of that insulating film so that the top of the insulating film IF2 is exposed.

As a result of the step described with reference to FIG. 9, the insulating film IF3 is configured by the insulating film embedded in each of the trenches D1 to D3 and the undepicted insulating film embedded in the region, from which the pattern extending in the y direction of the plate-like pattern is removed. The insulating film IF3 is formed by densifying a High Aspect Ratio Process (HARP) film, for example.

Figure 10:
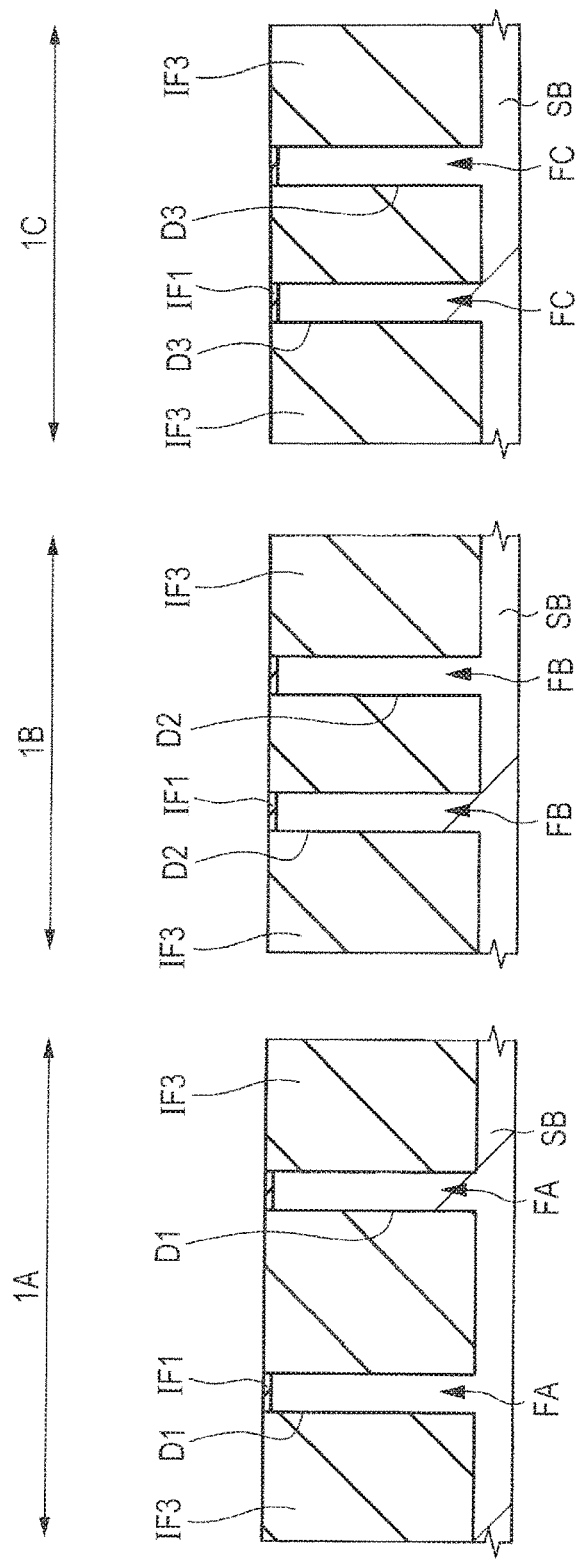
FIG. 10 includes sectional views explaining the manufacturing process of the semiconductor device following FIG. 9.

Subsequently, as shown in FIG. 10, wet etching is performed using hot phosphoric acid, thereby the insulating film IF2 is removed to expose the top of the insulating film IF1, and then isotropic etching is performed so that the top of the insulating film IF3 is retracted to a height equal to the height of the top of the insulating film IF1. At this time, since the insulating film IF1 has a high resistance against the etching compared with the insulating film IF3, the insulating film IF1 is substantially not removed.

Figure 11:
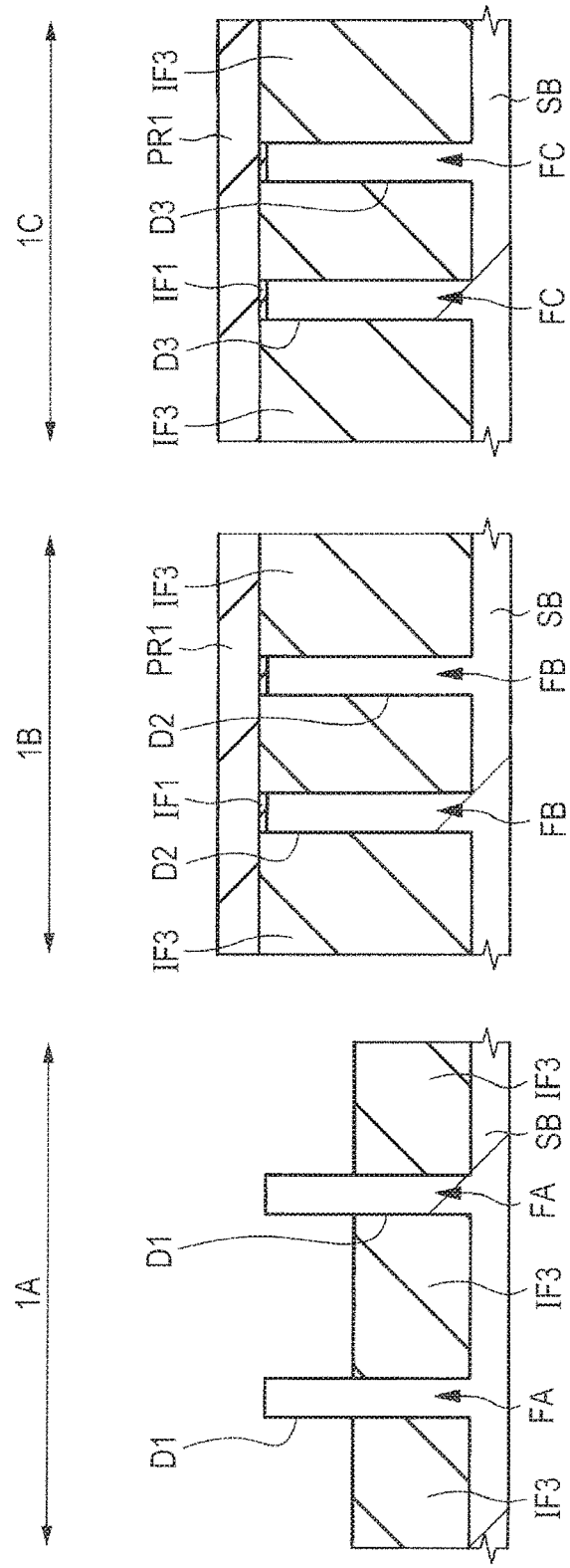
FIG. 11 includes sectional views explaining the manufacturing process of the semiconductor device following FIG. 10.

Subsequently, as shown in FIG. 11, a photoresist film PR1, which covers the logic region 1B and the I/O region 1C, but exposes the memory cell region 1A, is formed, and then the tops of the insulating films IF3 and IF1 in the memory cell region 1A are etched back. As a result, the insulating film IF1 is removed, and the top of the fin FA is exposed. The downward retraction of the top of the insulating film IF3 exposes the side surfaces of the fin FA, i.e., the side surfaces of the trench D1. That etchback may be performed using either a dry etching process or a wet etching process.

Figure 12:
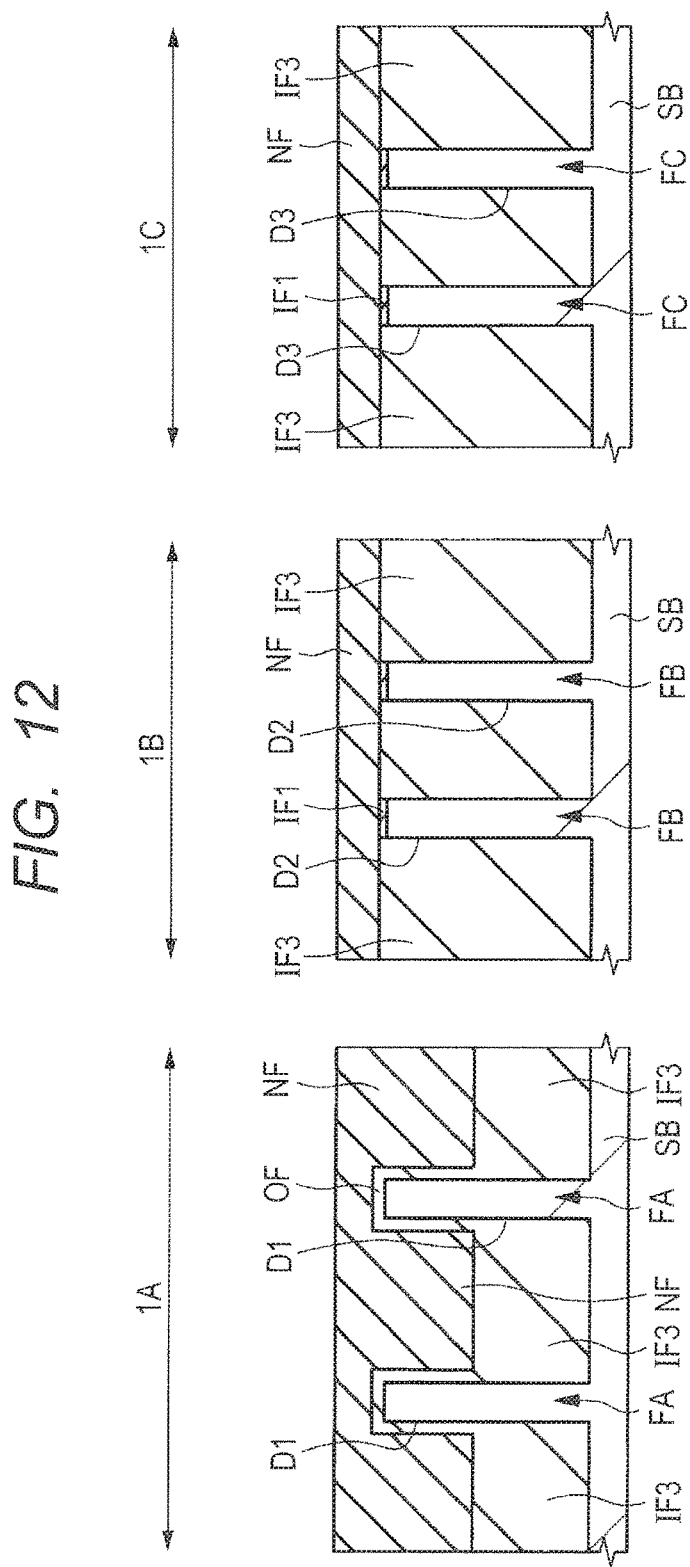
FIG. 12 includes sectional views explaining the manufacturing process of the semiconductor device following FIG. 11.

Subsequently, as shown in FIG. 12, the photoresist film PR1 is removed, and then the insulating film OF as a sacrificial oxide film is formed, and the silicon nitride film NF is formed on the insulating film OF, and then the top of the silicon nitride film NF is planarized using a CMP process, for example. The insulating film OF is formed by, for example, an oxidation process or a CVD process, and includes, for example, a silicon oxide film. As a result, the top of the insulating film IF3, the surface of the fin FA exposed from the insulating film IF3, and the top of the insulating film IF1 are covered with the insulating film OF. The silicon nitride film NF is formed by, for example, a CVD process, and is embedded in the trench D1 with the insulating film OF in between over the insulating film IF3 in the memory cell region 1A.

In the memory cell region 1A, the insulating films OF and IF3 are shown in an integrated manner. In the logic region 1B and the I/O region 1C, the insulating film OF is assumed to be integrated with the insulating films IF1 and IF3, respectively, and is thus not shown.

Figure 13:
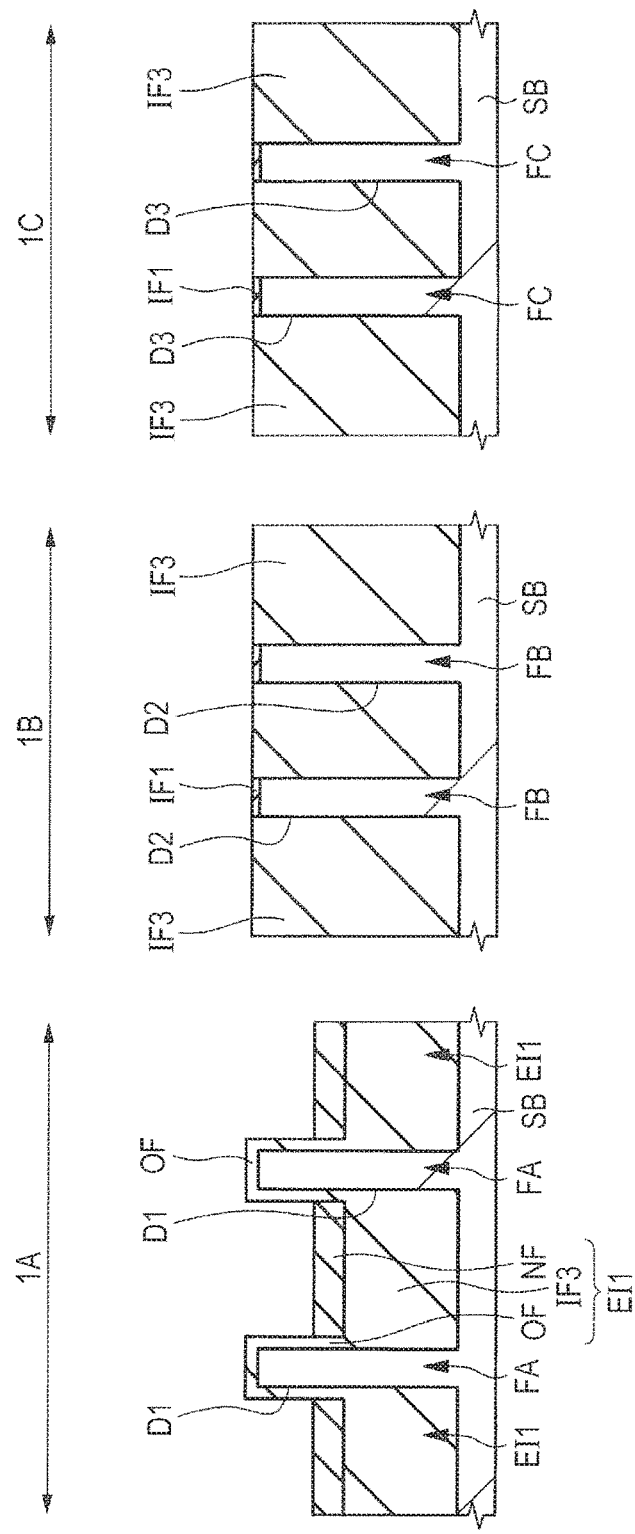
FIG. 13 includes sectional views explaining the manufacturing process of the semiconductor device following FIG. 12.

Subsequently, as shown in FIG. 13, etchback is performed to retract the top of the silicon nitride film NF to a position below the top of the fin FA. As a result, the trench D1 becomes in an incompletely filled state. A height of the fin FA protruding above the top of the silicon nitride film NF, i.e., a distance from the top of the fin FA to the top of the silicon nitride film NF in a direction (height direction, perpendicular direction) perpendicular to the main surface of the semiconductor substrate SB is, for example, 40 to 60 nm. The silicon nitride film NF that has been etched back has a thickness in the height direction of 5 to 15 nm, for example. As a result of this step, the surface of the insulating film OF located above the retracted top of the silicon nitride film NF is exposed. In the logic region 1B and the I/O region 1C, since the silicon nitride film NF is removed, the insulating films IF1 and IF3 are exposed from the silicon nitride film NF.

The insulating film IF3, the silicon nitride film NF, and the insulating film OF between the silicon nitride film NF and the fin FA configure the element isolation region (element isolation part) EI1. This embodiment is mainly characterized by forming the element isolation region EI1 having the top formed of the silicon nitride film NF in the memory cell region 1A.

Figure 14:
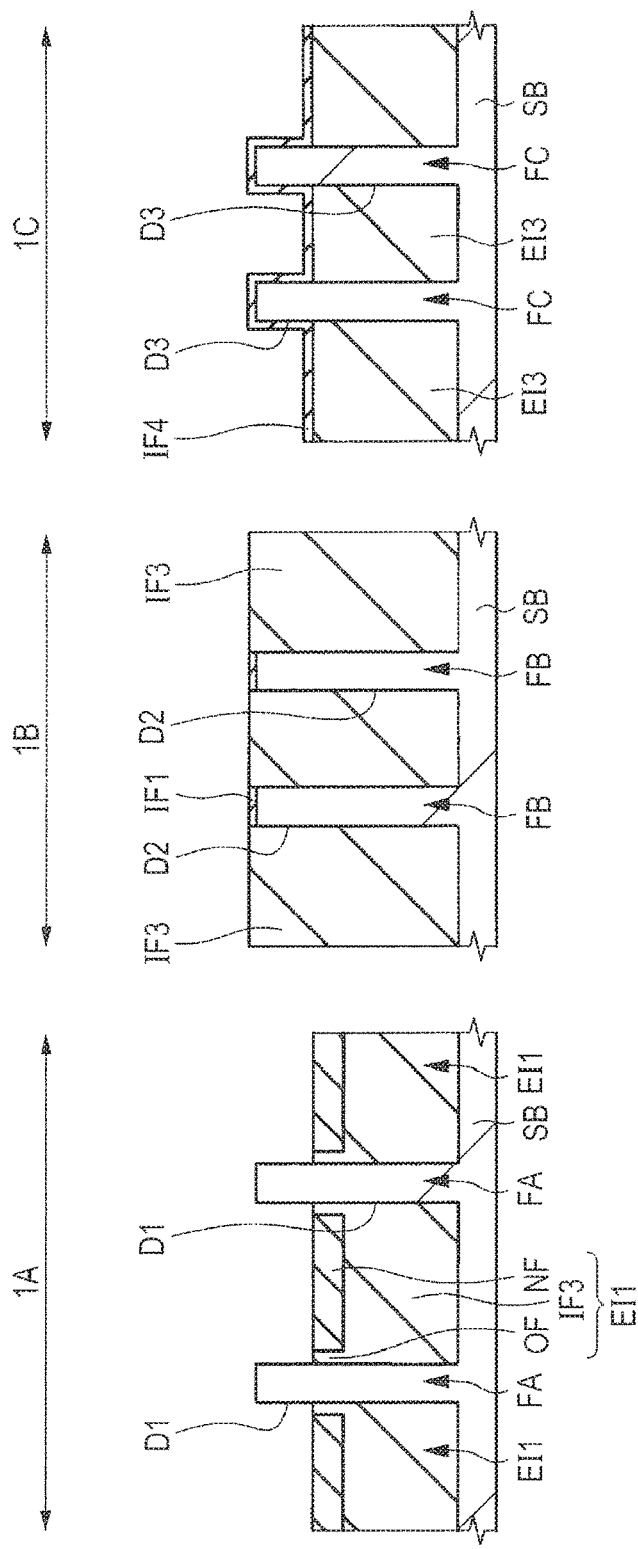
FIG. 14 includes sectional views explaining the manufacturing process of the semiconductor device following FIG. 13.

Subsequently, as shown in FIG. 14, the insulating film IF1 in the I/O region 1C is removed to retract the top of the insulating film IF3 in the I/O region 1C using a photolithography technique and an etching process. As a result, the top of the insulating film IF3 in the I/O region 1C is retracted to a position equal to a height of the top of the element isolation region EI1. The position of the top of the insulating film IF3 in the I/O region 1C may be higher by about 20 nm, for example, than the height of the top of the element isolation region EI1. Consequently, the insulating film IF3 having the retracted top in the I/O region 1C configures the element isolation region EI3.

Subsequently, an insulating film IF4 is formed on the semiconductor substrate by a combination of a thin-film oxidation step and a deposition step by a CVD process, for example. The insulating film IF4 covers the surface of the fin FC exposed from the element isolation region EI3, and includes, for example, a silicon oxide film. The insulating film IF4 forms a gate insulating film of the high-withstand-voltage transistor formed in the I/O region 1C in a later step. Subsequently, the insulating films IF4 and OF in the memory cell region 1A are removed using a photolithography technique and an etching process to expose the surface of the fin FA above the element isolation region EI1. In this operation, only the insulating film OF above the silicon nitride film NF is removed, and the insulating film OF in contact with the silicon nitride film NF is not removed. Although the insulating film IF4 is also formed in the logic region 1B, the insulating film IF4 in the logic region 1B is not shown in the drawings used in the following description.

Figure 15:
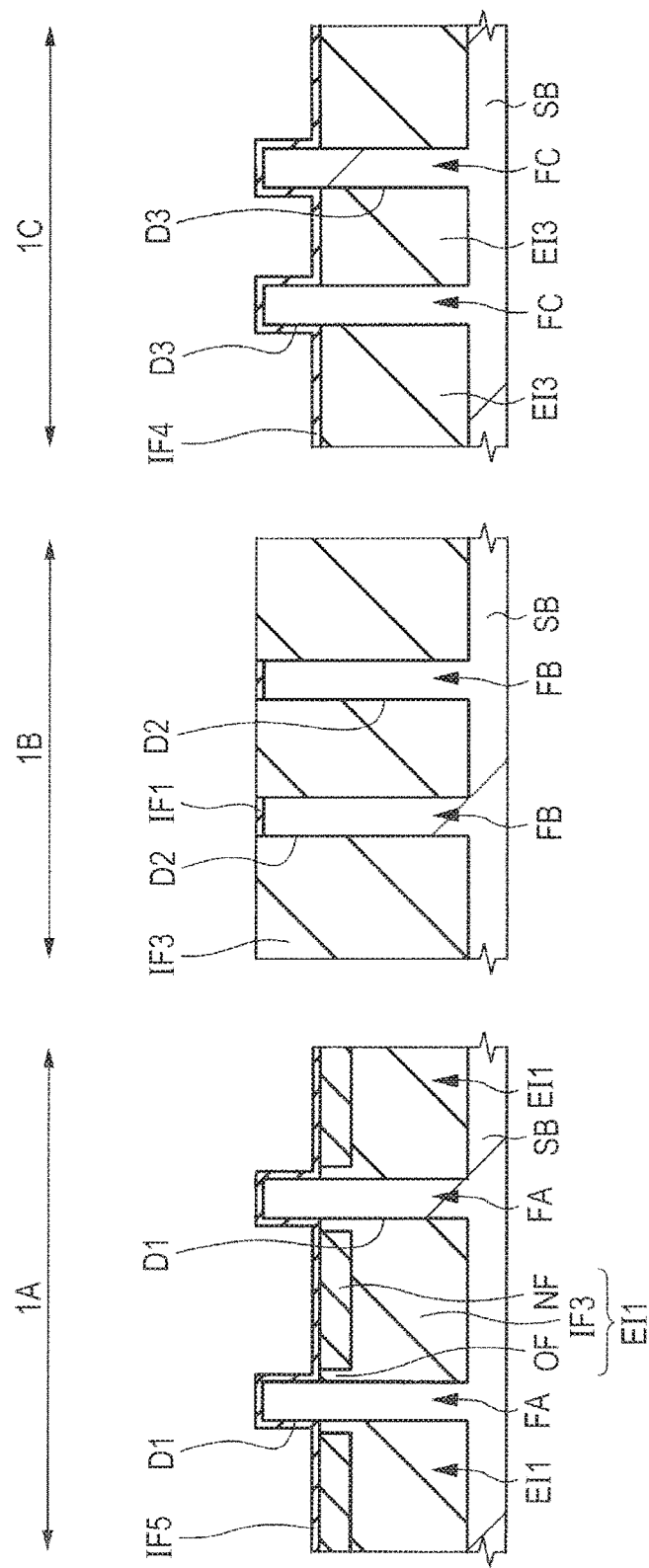
FIG. 15 includes sectional views explaining the manufacturing process of the semiconductor device following FIG. 14.

Subsequently, as shown in FIG. 15, an insulating film IF5 including, for example, a silicon oxide film is formed over the semiconductor substrate SB using an oxidation process, for example. The insulating film IF5 covers the side surface and the top of the fin FA, and forms a gate insulating film of the control transistor in the memory cell region 1A in a later step. The insulating film IF5 is also formed on the top of the silicon nitride film NF. Although the insulating film IF5 is also formed in the logic region 1B and the I/O region 1C, the insulating film IF5 is assumed to be integrated with the insulating film covering each of the regions 1B and 1C, and is thus not shown.

Figure 16:
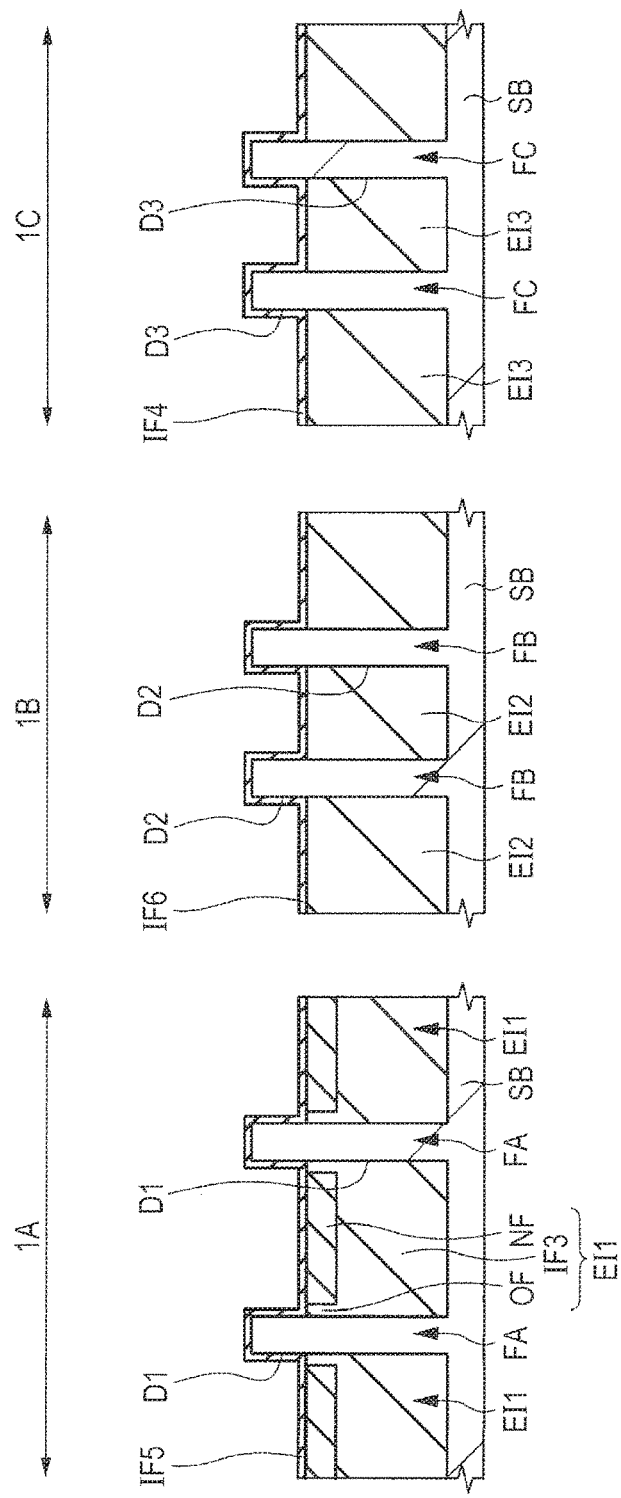
FIG. 16 includes sectional views explaining the manufacturing process of the semiconductor device following FIG. 15.

Subsequently, as shown in FIG. 16, the insulating film IF1 in the logic region 1B is removed to retract the top of the insulating film IF3 in the logic region 1B using a photolithography technique and an etching process. As a result, the top of the insulating film IF3 in the logic region 1B is retracted to a position equal to the height of the top of the element isolation region EI1. The position of the top of the insulating film IF3 in the logic region 1B may be higher by about 20 nm, for example, than the height of the top of the element isolation region EI1. The insulating films IF4 and IF5 are not removed to protect the memory cell region 1A and the I/O region 1C.

Consequently, the insulating film IF3 having the retracted top in the logic region 1B configures an element isolation region EI2. In this way, each of the element isolation region EI2 and EI3 in the logic region 1B and the I/O region 1C includes only the silicon oxide film, and has the top that is not covered with the silicon nitride film. On the other hand, most of the top of the element isolation region EI1 in the memory cell region 1A is configured by the silicon nitride film NF.

Subsequently, a p-type impurity is introduced by an ion implantation process or the like into the surface of each of the fins FA, FB, and FC as necessary to form an undepicted p-type semiconductor region configuring the channel region.

Subsequently, an insulating film IF6 covering the surface of the fin FB exposed from the element isolation region EI2 is formed using an oxidation process, for example. The insulating film IF6 includes, for example, a silicon oxide film, and has a smaller thickness than the insulating film IF4. In that oxidation step, the respective thicknesses of the insulating films IF5 and IF4 are substantially not increased in the memory cell region 1A and the I/O region 1C.

Figure 17:
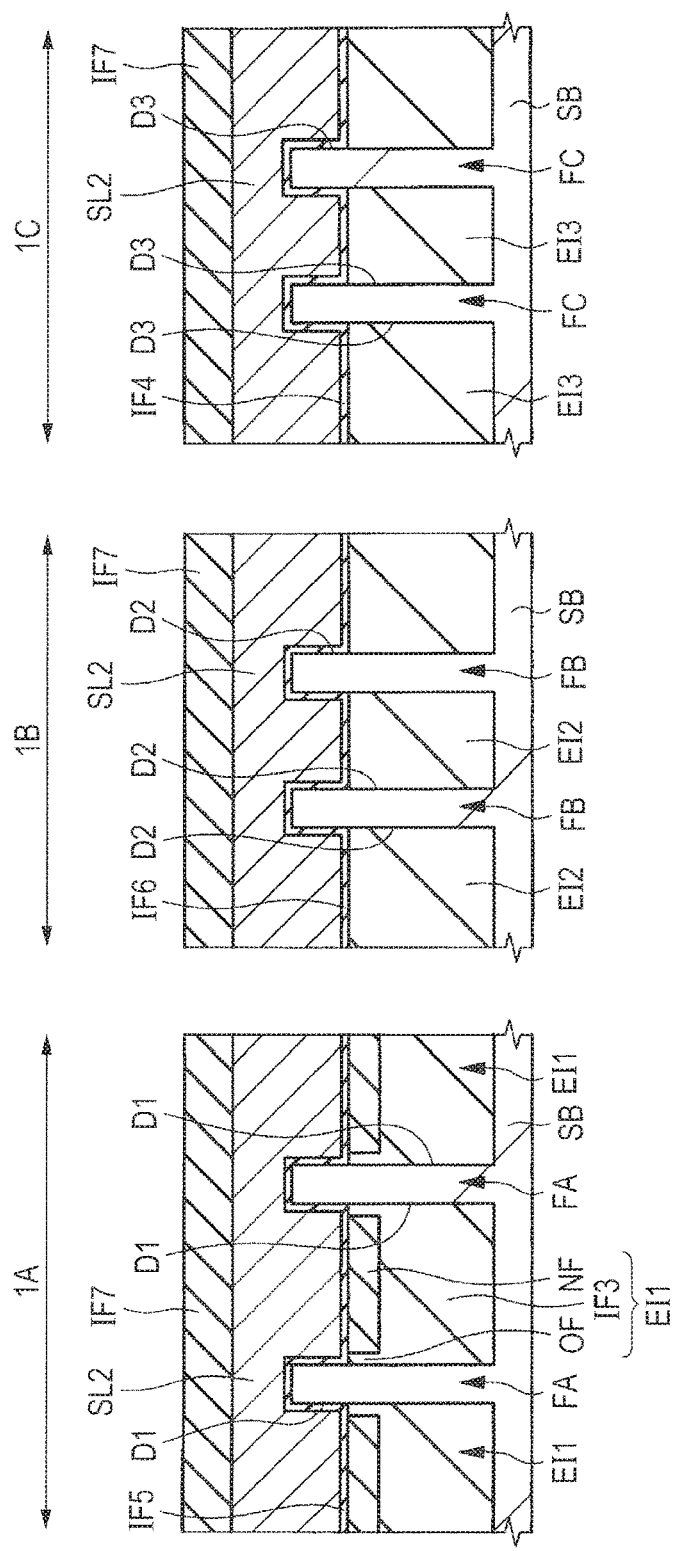
FIG. 17 includes sectional views explaining the manufacturing process of the semiconductor device following FIG. 16.

Subsequently, as shown in FIG. 17, a polysilicon film (conductor film) SL2 is formed using, for example, a CVD process on each of the element isolation regions EI1, EI2, and EI3, the fins FA, FB, and FC, and the insulating films IF4 to IF6, and then the top of the polysilicon film SL2 is polished by a CMP process. Subsequently, while not shown, the top of the polysilicon film SL2 is thermally oxidized to form a silicon oxide film covering that top. Subsequently, an insulating film IF7 is formed on the polysilicon film SL2 using a CVD process, for example. The insulating film IF7 includes, for example, a silicon nitride film.

Figure 18:
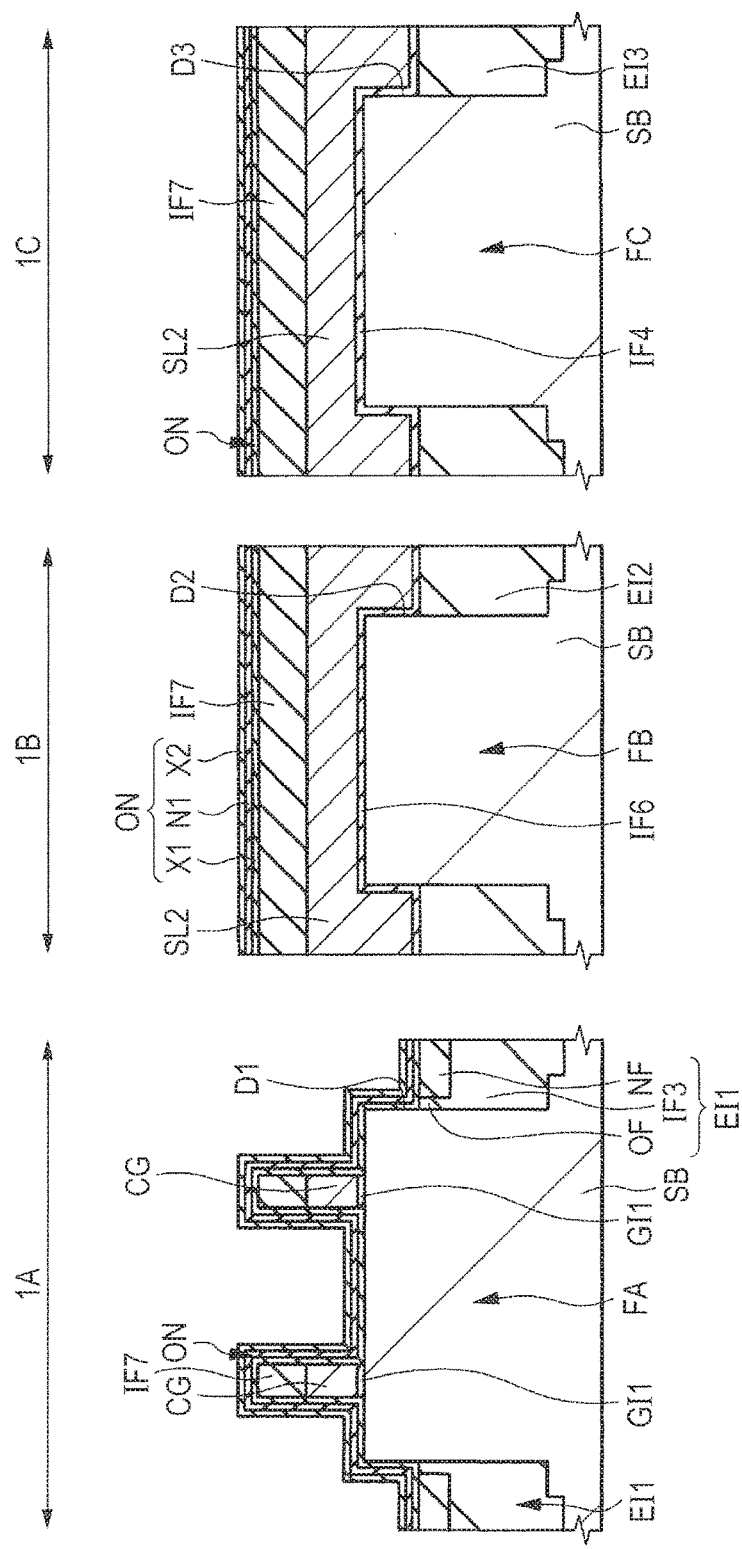
FIG. 18 includes sectional views explaining the manufacturing process of the semiconductor device following FIG. 17.

Subsequently, as shown in FIG. 18, the insulating film IF7, the polysilicon film SL2, and the insulating film IF5 in the memory cell region 1A are processed using a photolithography technique and a dry etching process. Specifically, patterning is performed while the logic region 1B and the I/O region 1C are covered with an undepicted photoresist film. The photoresist film is removed after that patterning. As a result, stacked patterns each including the insulating film IF7, the polysilicon film SL2, and the insulating film IF5 are formed side by side in the x direction directly over the fin FA. As a result of the patterning, the control gate electrode CG including the polysilicon film SL2 and the gate insulating film GI1 including the insulating film IF5 are formed.

A section of each region of FIG. 18 is orthogonal to the section of each region shown in FIG. 17 and along the y direction. While not shown, the stacked pattern including the gate insulating film GI1, the control gate electrode CG, and the insulating film IF7 is also formed directly over the element isolation region EI1 adjacent to the fin FA in this step. At this time, the top of the element isolation region EI1 is subjected to etching. In other words, the top of the silicon nitride film NF configuring the top of the element isolation region EI1 is exposed.

Subsequently, a cleaning step is performed to remove the residue produced by the etching performed in the above-described processing step. At this time, the top of the element isolation region EI1 is subjected to a cleaning liquid.

The stacked pattern including the insulating film IF3 and the control gate electrode CG extends in the y direction, and is disposed so as to straddle the fins FA. In the memory cell region 1A, the insulating film IF7, the polysilicon film SL2, and the insulating film IF5 in the memory cell region 1A are removed by the etching in any region other than the portions, in each of which that stacked pattern is formed, thereby the surface of the fin FA and the top of the element isolation region EI1 are exposed in the region other than the portions.

Subsequently, thermal oxidation is performed to oxidize the surface of the fin FA and the side surfaces of the control gate electrode CG exposed from the gate insulating film GI1 and the element isolation region EI1. As a result, a silicon oxide film (bottom-oxidized film) X1, which covers the surface of the fin FA and the side surfaces of the control gate electrode CG, is formed. The manufacturing process is described on the assumption that the surface of the element isolation region EI1 and the surface of the insulating film IF7 are also covered with the silicon oxide film X1.

Subsequently, a silicon nitride film N1 is formed on the silicon oxide film X1 using a CVD process, for example. The silicon nitride film N1 serves as a trapping insulating film for storing electric charges in the memory cell formed later. Although it has been described that the silicon nitride film N1 is formed as the charge storage film, not only the silicon nitride film but an insulating film including, for example, hafnium silicate (HfSiO) may be formed as a material of the charge storage film. Subsequently, a silicon oxide film (top oxide film) X2 is formed on the silicon nitride film N1 using a CVD process, for example.

The stacked film including the silicon oxide film X1, the silicon nitride film N1, and the silicon oxide film X2 stacked in order over the semiconductor substrate SB configures the ONO film ON. The ONO film ON in contact with the side surface of the control gate electrode CG includes the silicon oxide film X1, the silicon nitride film N1, and the silicon oxide film X2 formed in the x direction in order from a control gate electrode CG side. The material of the top oxide film as the uppermost layer of the ONO film ON is not limited to silicon oxide, and may be alumina ($Al_2O_3$), for example. The ONO film ON is formed on the insulating film IF7 in each of the logic region 1B and the I/O region 1C. The ONO film ON has a thickness of about 20 nm, for example.

Figure 19:
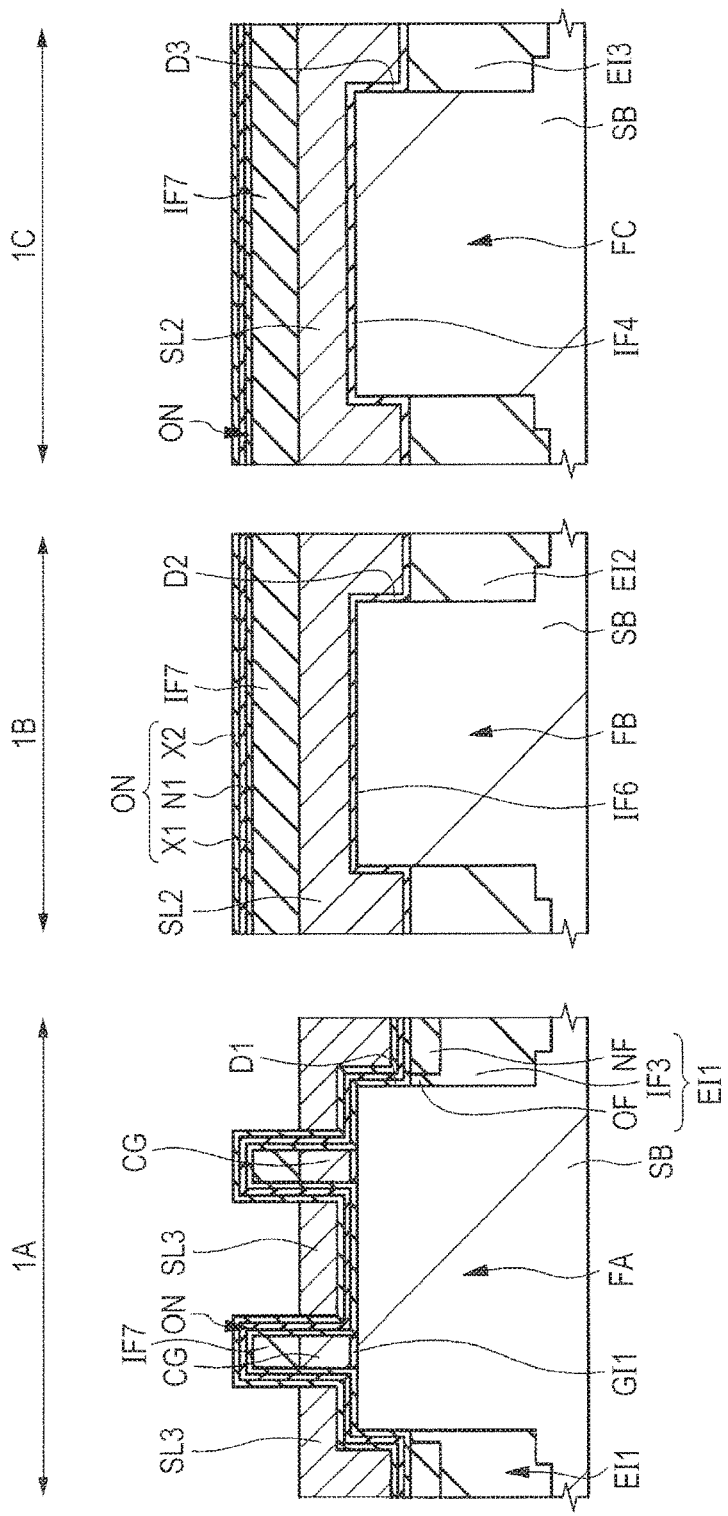
FIG. 19 includes sectional views explaining the manufacturing process of the semiconductor device following FIG. 18.

Subsequently, as shown in FIG. 19, a polysilicon film SL3 is formed on the ONO film ON using a CVD process, for example. The thickness of the polysilicon film SL3 is equal to or larger than the thickness of at least the control gate electrode CG. The polysilicon film SL3 is formed with a thickness larger than the thickness of a stacked film including the control gate electrode CG and the insulating film IF7 to cover a stacked film including the control gate electrode CG, the insulating film IF7, and the ONO film ON. Subsequently, the top of the polysilicon film SL3 is planarized using a CMP process or the like.

Subsequently, the top of the polysilicon film SL3 is retracted by performing etchback to align the height of the top of the polysilicon film SL3 with the height of the top of the control gate electrode CG. As a result, the insulating film IF7 and the ONO film ON covering the insulating film IF7 protrude above the top of the polysilicon film SL3. The polysilicon film SL3 is removed from the logic region 1B and the I/O region 1C through the planarization step and the etchback step on the polysilicon film SL3.

Figure 20:
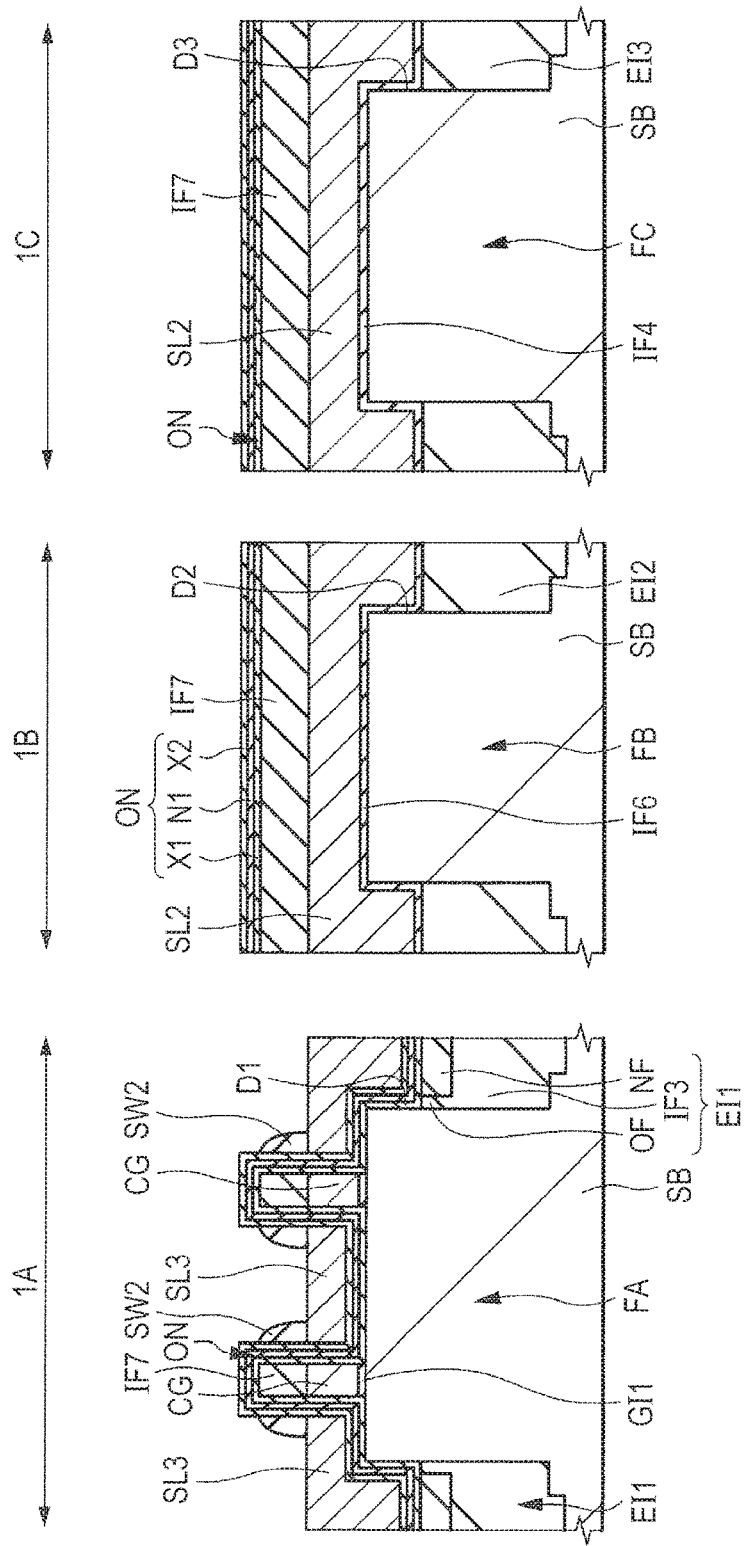
FIG. 20 includes sectional views explaining the manufacturing process of the semiconductor device following FIG. 19.

Subsequently, as shown in FIG. 20, an insulating film is formed on the ONO film ON and the polysilicon film SL3 using a CVD process, for example. That insulating film includes, for example, a silicon nitride film, and has a thickness of 10 to 50 nm, for example. Subsequently, the top of the polysilicon film SL3 and the top of the ONO film ON directly over the insulating film IF7 are exposed from the insulating film by performing dry etching. As a result, a sidewall SW2 including the insulating film is formed on the side surfaces of the insulating film IF7 with the ONO film ON in between. The insulating film is removed from the logic region 1B and the I/O region 1C by such a dry etching step.

Figure 21:
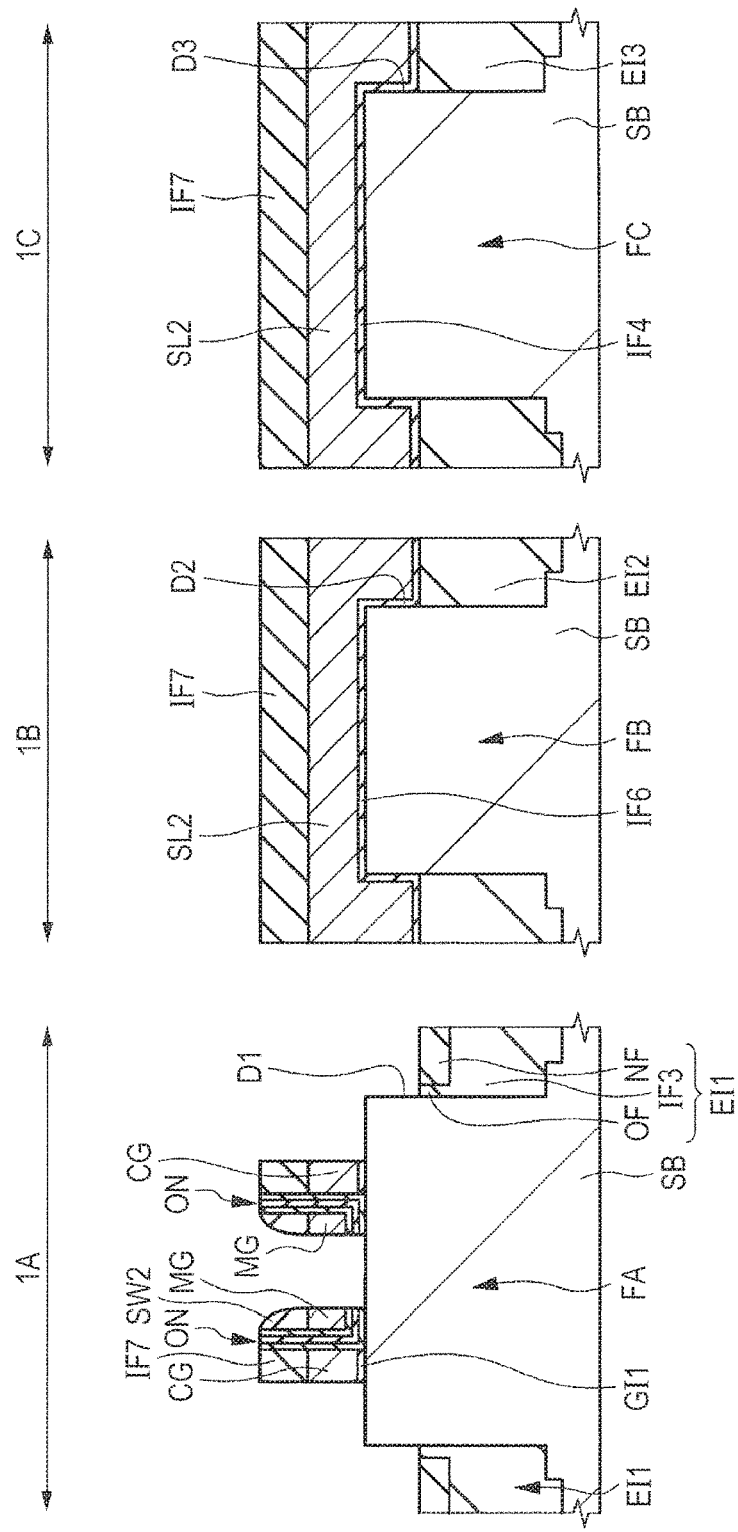
FIG. 21 includes sectional views explaining the manufacturing process of the semiconductor device following FIG. 20.

Subsequently, as shown in FIG. 21, the polysilicon film SL3 is processed by performing dry etching using the sidewall SW2 as a hard mask. As a result, the top of the ONO film ON in contact with the surface of the fin FA is exposed from the polysilicon film SL3. The memory gate electrode MG including a pattern of the polysilicon film SL3 is formed with the ONO film ON in between on both lateral sides of the control gate electrode CG. However, the memory gate electrode MG adjacent to one side surface of the control gate electrode CG is a pattern to be removed in a later step, and thus does not remain in a completed semiconductor device.

Subsequently, the memory gate electrode MG adjacent to one side surface of a stacked film including the control gate electrode CG and the insulating film IF7, and the sidewall SW2 directly over that memory gate electrode MG are removed using a photolithography technique and an etching process. Consequently, the memory gate electrode MG adjacent to the other side surface of the control gate electrode CG remains. Subsequently, the ONO film ON exposed from the control gate electrode CG and the memory gate electrode MG is removed.

Specifically, the ONO film ON exclusively remains between the memory gate electrode MG and the fin FA, between the memory gate electrode MG and the control gate electrode CG, and between the sidewall SW2 and the insulating film IF7. Hence, in the memory cell region 1A, the surface of the fin FA and the surface of the element isolation region EI1 are exposed from the ONO film ON in a region exposed from the control gate electrode CG and the memory gate electrode MG. That is, the top of the element isolation region EI1 is subjected to etching for removing the ONO film ON. In other words, the top of the silicon nitride film NF configuring the top of the element isolation region EI1 is exposed. The top of the insulating film IF7 is exposed in the logic region 1B and the I/O region 1C.

Subsequently, a cleaning step is performed to remove the residue and the like produced by the etching. At this time, the top of the element isolation region EI1 is subjected to the cleaning liquid.

The ONO film ON extending along the top of the fin FA, i.e., along the semiconductor substrate SB, and the ONO film ON extending along the side surface of the control gate electrode CG are continuously formed while having an L-shaped section. A pair of patterns, which each include the control gate electrode CG and the memory gate electrode MG adjacent to the control gate electrode CG with the ONO film ON in between, are formed on the fin FA, and the pair of memory gate electrodes MG are opposed to each other between the pair of control gate electrodes CG.

Figure 22:
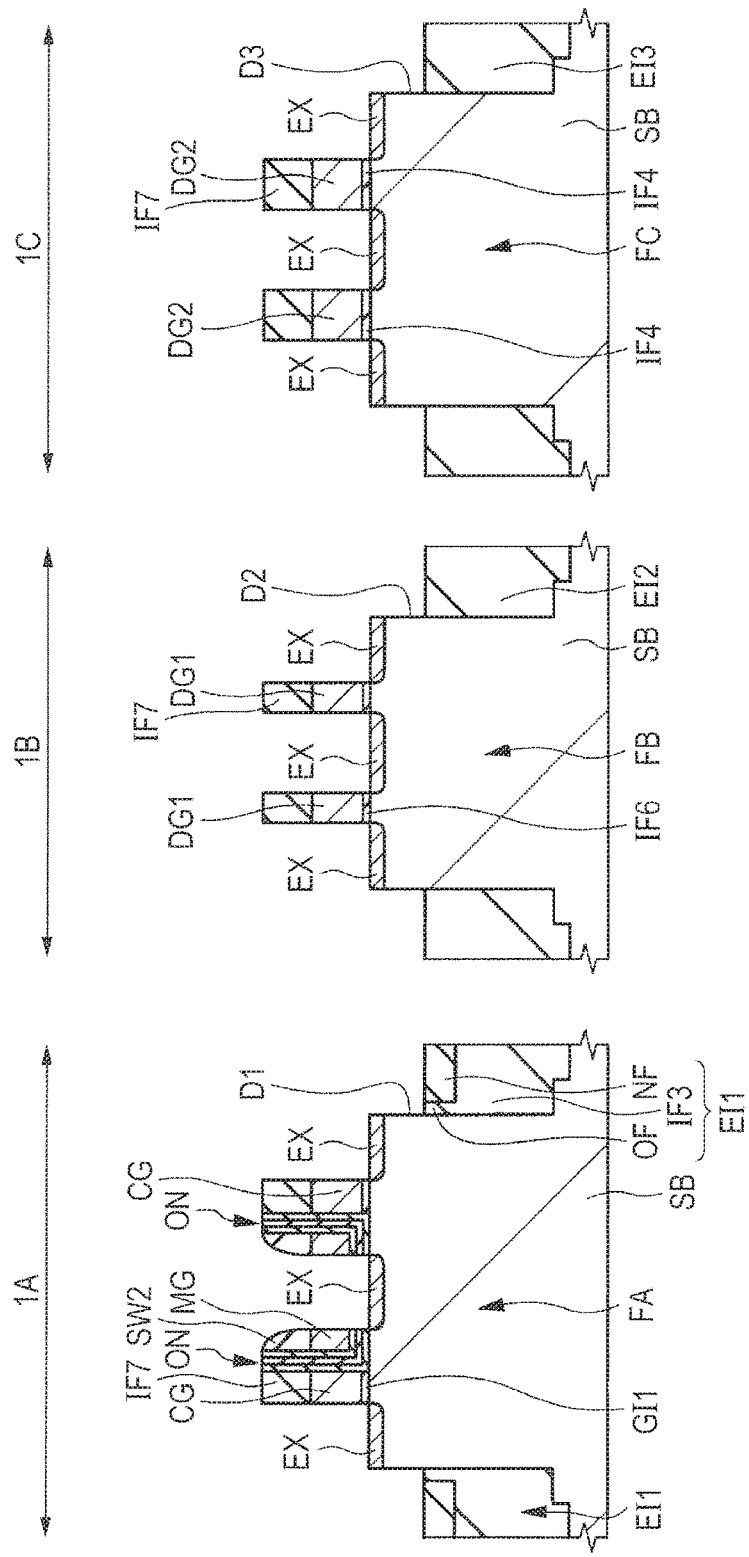
FIG. 22 includes sectional views explaining the manufacturing process of the semiconductor device following FIG. 21.

Subsequently, as shown in FIG. 22, the insulating film IF7 is processed in the logic region 1B and the I/O region 1C using a photolithography technique and a dry etching process, and subsequently the polysilicon film SL2 and the insulating films IF4 and IF6 are processed. As a result, a pair of stacked films, which each include a dummy gate electrode DG1 including the insulating film IF6 and the polysilicon film SL2 and the insulating film IF7 on the dummy gate electrode DG1, are formed side by side in the x direction directly over the fin FB. In addition, a pair of stacked films, which each include a dummy gate electrode DG2 including the insulating film IF4 and the polysilicon film SL2 and the insulating film IF7 on the dummy gate electrode DG1, are formed side by side in the x direction directly over the fin FC.

The fin FB and the element isolation region EI2 are exposed in a region beside the dummy gate electrode DG1. The fin FC and the element isolation region EI3 are exposed in a region beside the dummy gate electrode DG2. Each of the dummy gate electrodes DG1 and DG2 is a pseudo gate electrode to be removed in a later step, and does not remain in a completed semiconductor device.

Subsequently, an ion implantation step is performed using the insulating film IF7, the sidewall SW2, and the ONO film ON as a mask to implant an n-type impurity ((for example, phosphorus (P) or arsenic (As)) into each of the tops of the fins FA, FB, and FC. As a result, a plurality of extension regions EX, which are each an n-type semiconductor region having a relatively low impurity concentration, are formed. The extension region EX in the memory cell region 1A is formed in the top of the fin FA beside the pattern including the control gate electrode CG and the memory gate electrode MG adjacent to the control gate electrode CG with the ONO film ON in between. The extension region EX in the logic region 1B is formed in the top of the fin FB beside the dummy gate electrode DG1. The extension region EX in the I/O region 1C is formed in the top of the fin FC beside the dummy gate electrode DG2. A p-type impurity (for example, boron (B)) may be implanted as halo implantation into the fins FA, FB, and FC as necessary.

Figure 23:
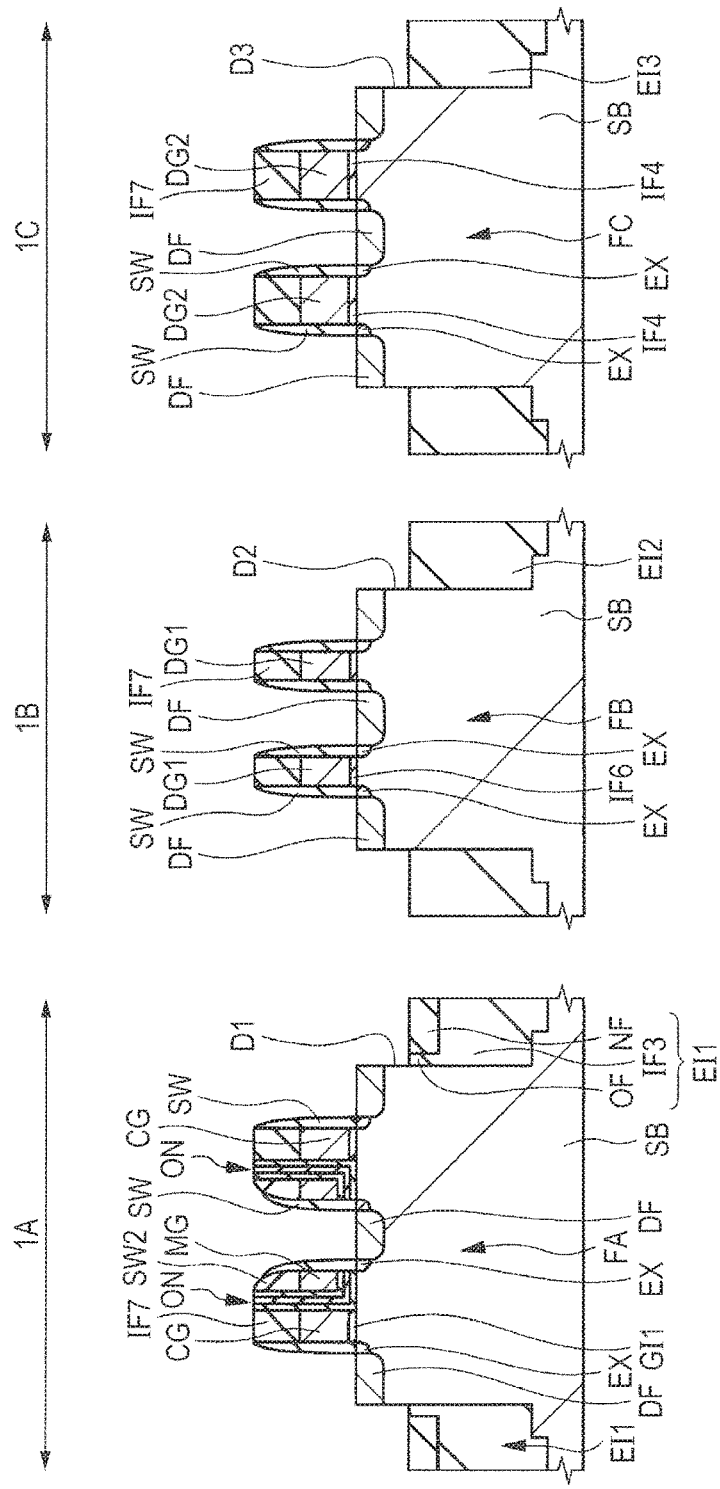
FIG. 23 includes sectional views explaining the manufacturing process of the semiconductor device following FIG. 22.

Subsequently, as shown in FIG. 23, an insulating film is formed over the semiconductor substrate SB using a CVD process, for example. That insulating film includes, for example, a silicon oxide film, a silicon nitride film, or a stacked film thereof. Subsequently, dry etching is performed so that the tops of the fins FA, FB, and FC and the top of the insulating film IF7 are exposed from that insulating film. As a result, in the memory cell region 1A, a sidewall SW including the insulating film is formed on a side surface on either side of a pattern including the control gate electrode CG, the memory gate electrode MG, the ONO film ON, the insulating film IF7, and the sidewall SW2. In the logic region 1B, a sidewall SW including the insulating film is formed on a side surface on either side of a stacked film including the dummy gate electrode DG1 and the insulating film IF7. In the I/O region 1C, a sidewall SW including the insulating film is formed on a side surface on either side of a stacked film including the dummy gate electrode DG2 and the insulating film IF7.

At this time, the top of the element isolation region EI1 is subjected to the dry etching to form the sidewall SW. In other words, the top of the silicon nitride film NF configuring the top of the element isolation region EI1 is exposed. Subsequently, a cleaning step is performed to remove the residue and the like produced by that etching. At this time, the top of the element isolation region EI1 is subjected to a cleaning liquid.

Subsequently, an ion implantation step is performed using the insulating film IF7, the sidewalls SW and SW2, and the ONO film ON as a mask to implant an n-type impurity (for example, phosphorus (P) or arsenic (As)) into each of the tops of the fins FA, FB, and FC. Consequently, a plurality of diffusion layers DF, which are each an n-type semiconductor region having a relatively high impurity concentration, are formed. The diffusion layer DF in the memory cell region 1A is formed in the top of the fin FA beside the pattern including the control gate electrode CG and the memory gate electrode MG adjacent to the control gate electrode CG with the ONO film ON in between. The diffusion layer DF in the logic region 1B is formed in the top of the fin FB beside the dummy gate electrode DG1. The diffusion layer DF in the I/O region 1C is formed in the top of the fin FC beside the dummy gate electrode DG2.

The diffusion layer DF is formed at a position distant from the control gate electrode CG, the memory gate electrode MG, or the dummy gate electrode DG1 in the x direction compared with the extension region EX in contact with the diffusion layer DF. The diffusion layer DF has a large depth and a high impurity concentration compared with the extension region EX. The extension region EX and the diffusion layer DF, which are in contact with each other, configure the source-and-drain region of a transistor. Subsequently, heat treatment is performed as necessary to activate impurities in the extension region EX and the diffusion layer DF.

Although it has been described that the source-and-drain regions in the memory cell region 1A, the logic region 1B, and the I/O region 1C are formed in the same step, the extension region EX and the diffusion layer DF may be formed in different steps between the regions. It has been described that the source-and-drain region is formed by ion implantation. In place of the ion implantation, however, epitaxial layers each containing an introduced impurity may be formed using an epitaxial growth process on the surface of the fin beside each gate electrode.

Figure 24:
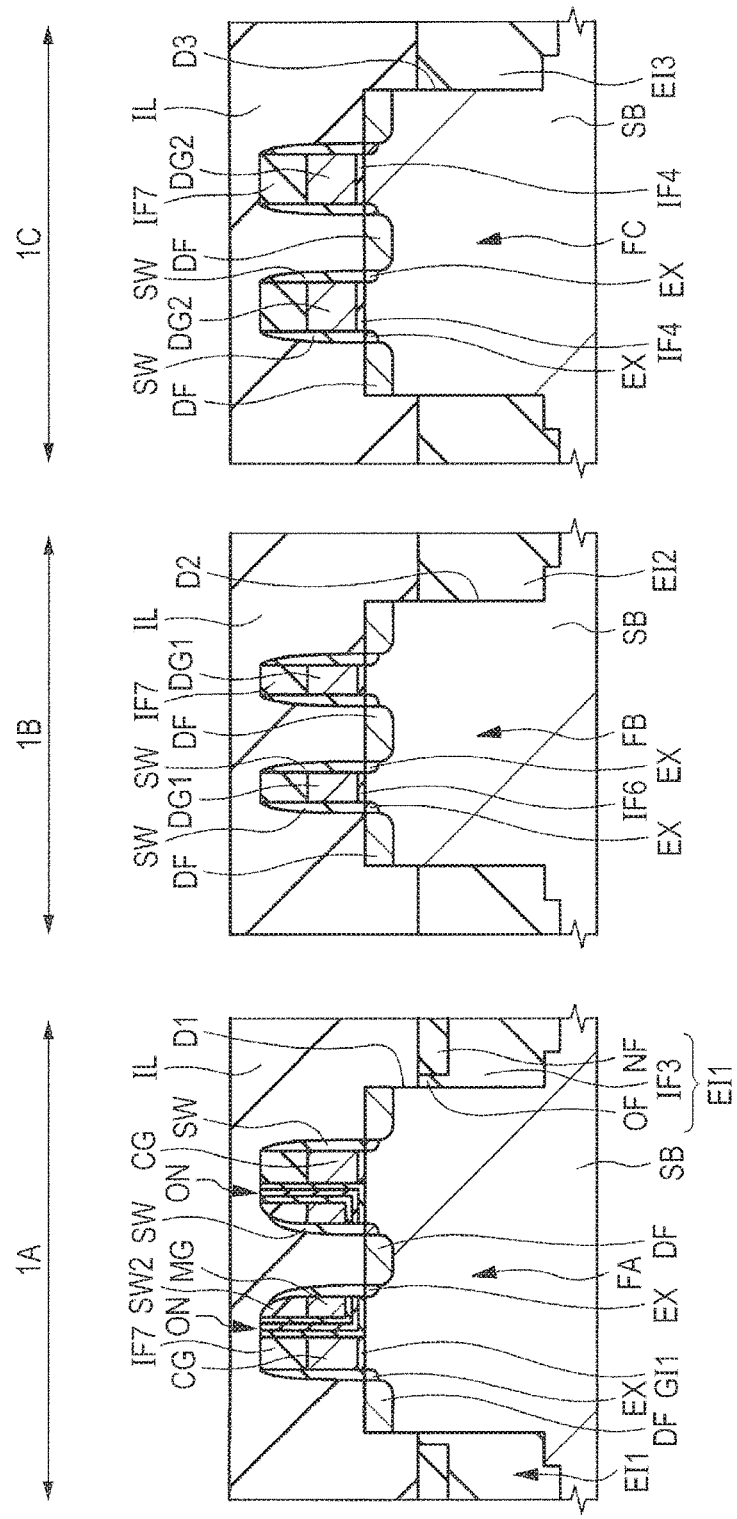
FIG. 24 includes sectional views explaining the manufacturing process of the semiconductor device following FIG. 23.

Subsequently, as shown in FIG. 24, an undepicted insulating film including, for example, a silicon nitride film having a thickness of 5 to 20 nm and the interlayer insulating film IL including, for example, a silicon oxide film are formed in order over the semiconductor substrate SB using a CVD process, for example. The interlayer insulating film IL has a thickness larger than the thickness of at least the control gate electrode CG, and herein has a thickness larger than the thickness of the stacked film including the gate insulating film GI1, the control gate electrode CG, and the insulating film IF7. The interlayer insulating film is formed so as to fill the inside of each of the trench D1 on the element isolation region EI1, the trench D2 on the element isolation region EI2, and the trench D3 on the element isolation region EI3.

Figure 25:
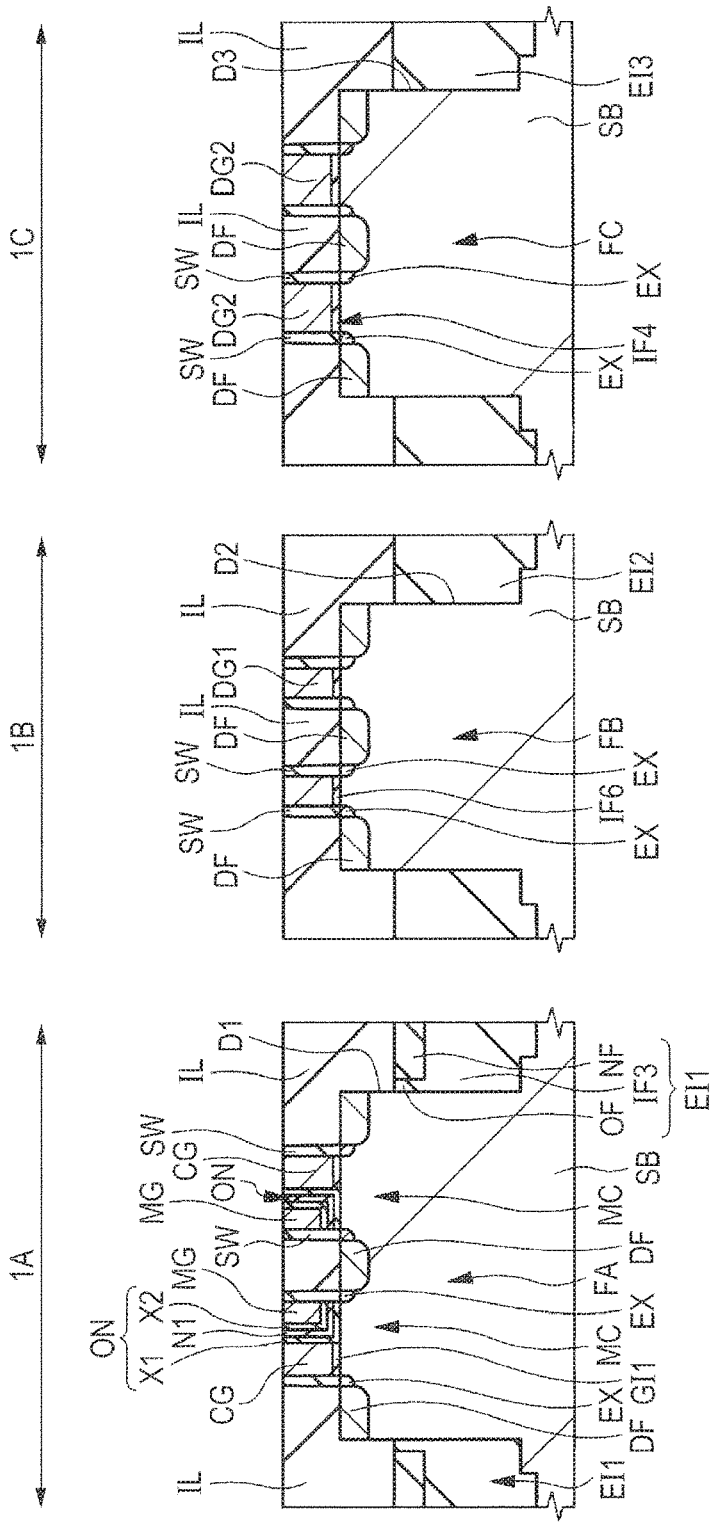
FIG. 25 includes sectional views explaining the manufacturing process of the semiconductor device following FIG. 24.

Subsequently, as shown in FIG. 25, the top of the interlayer insulating film IL is planarized by polishing using, for example, a CMP process. In that polishing step, the insulating film IF7 and the sidewall SW2 are entirely removed, and part of the upper part of each of the sidewall SW and the ONO film ON is removed, so that the tops of the control gate electrode CG, the memory gate electrode MG, and the dummy gate electrodes DG1 and DG2 are exposed. That is, the tops of the control gate electrode CG, the memory gate electrode MG, the dummy gate electrodes DG1 and DG2, the ONO film ON, the sidewall SW, and the interlayer insulating film IL are planarized in substantially the same plane so as to be flush with one another.

Consequently, the split-gate memory cell MC is configured by the control gate electrode CG and the memory gate electrode MG, the tops of which are exposed, and the source-and-drain region, which includes the extension region EX and the diffusion layer DF formed on either side of the pattern including the control gate electrode CG and the memory gate electrode MG. In other words, the memory cell MC configures a MONOS nonvolatile memory including a first transistor including the control gate electrode CG and a second transistor including the memory gate electrode MG.

Figure 26:
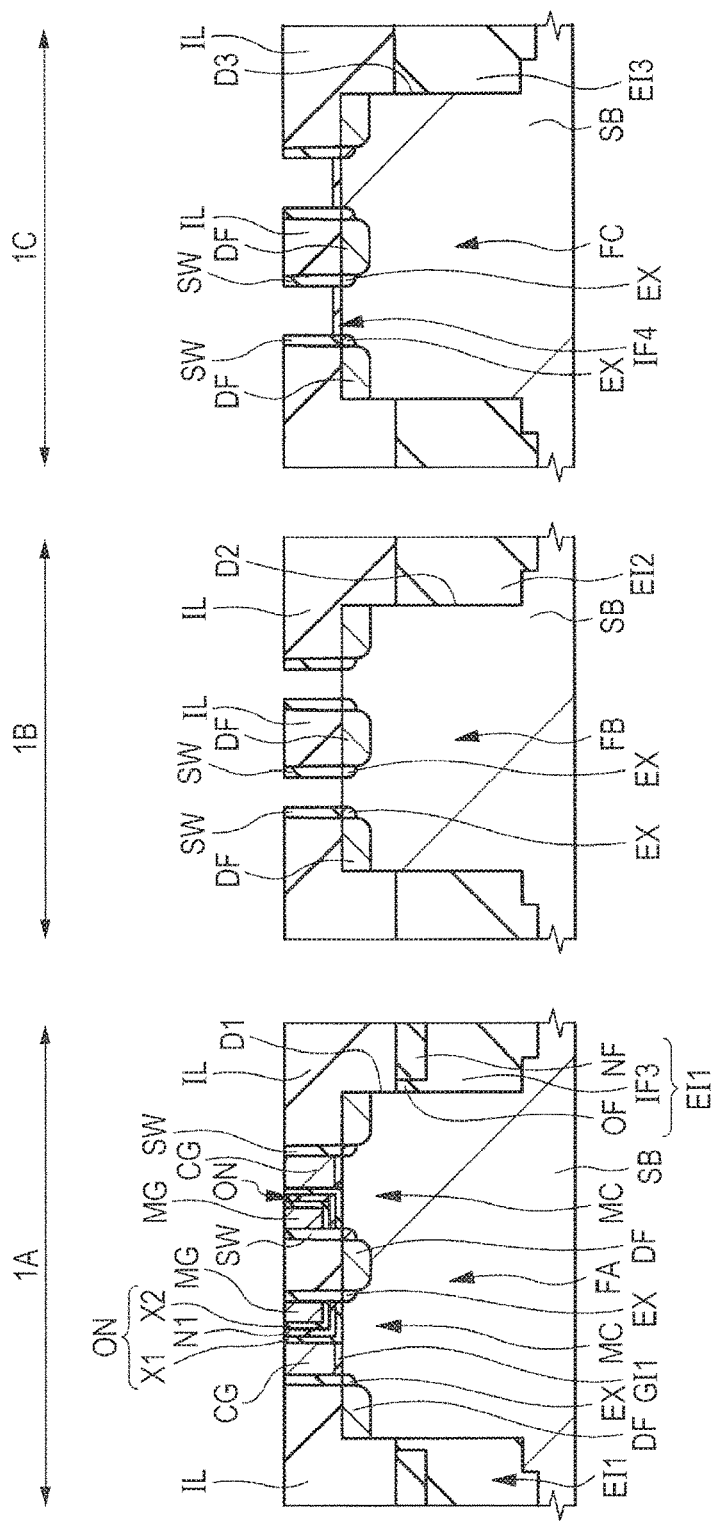
FIG. 26 includes sectional views explaining the manufacturing process of the semiconductor device following FIG. 25.

Subsequently, as shown in FIG. 26, wet etching is performed while the control gate electrode CG and the memory gate electrode MG in the memory cell region 1A are protected by an undepicted photoresist film, thereby the dummy gate electrodes DG1 and DG2 are removed. Subsequently, the insulating film IF6 is removed while the insulating film IF4 is left. The insulating film IF6 may not be removed so as to be used as part of a gate insulating film formed in the logic region 1B in a later step. As a result of such a removal step, a trench is formed in a region, from which the dummy gate electrode DG1 and the insulating film IF6 are removed, in the logic region 1B. A trench is formed in the region, from which the dummy gate electrode DG1 is removed, in the I/O region 1C. Subsequently, the photoresist film in the memory cell region 1A is removed.

Figure 27:
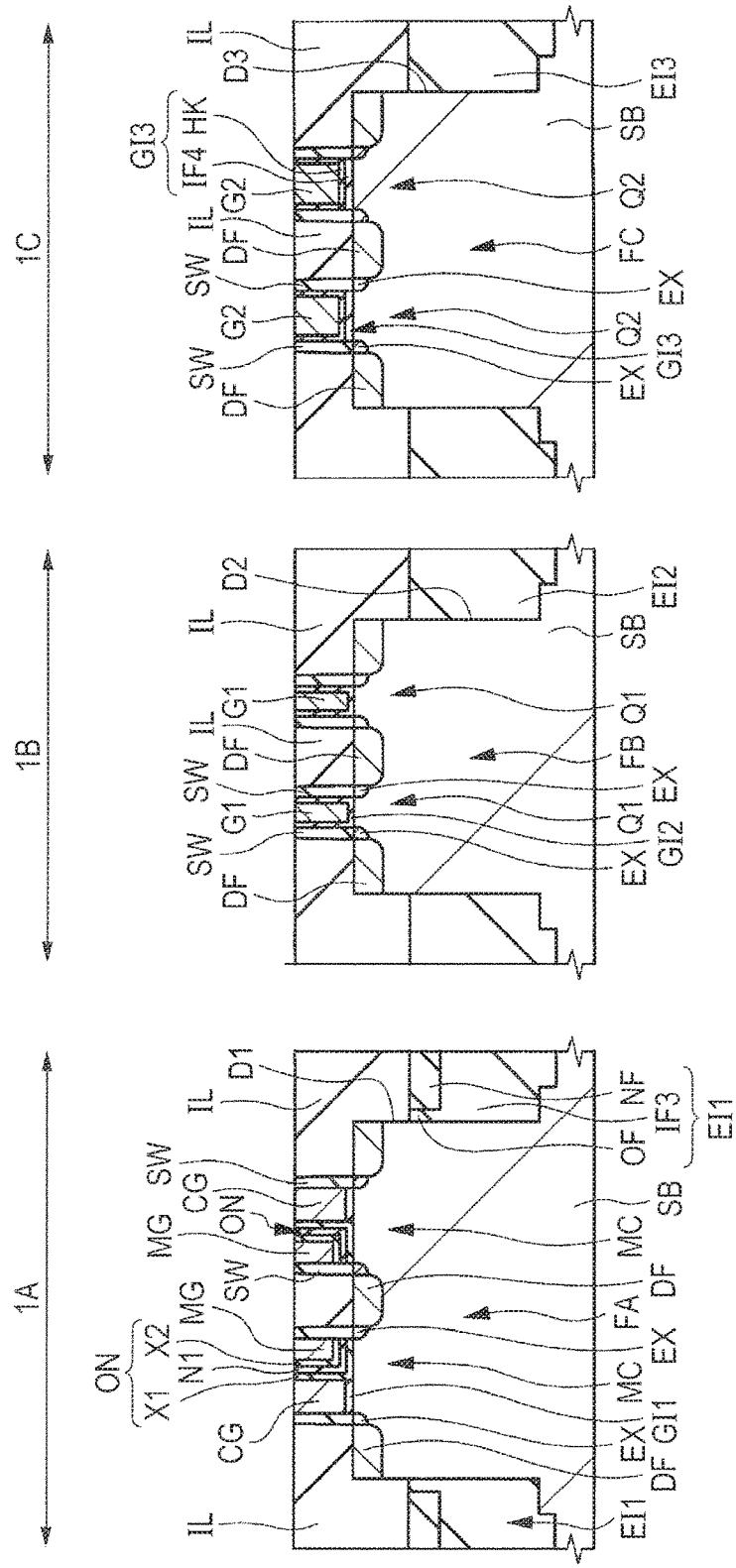
FIG. 27 includes sectional views explaining the manufacturing process of the semiconductor device following FIG. 26.

Subsequently, as shown in FIG. 27, a high-k film HK is formed over the semiconductor substrate SB using, for example, an atomic layer deposition (ALD) process, and then a metal film is formed on the high-k film HK by, for example, a sputtering process, thereby the inside of each of the trenches in the logic region 1B and the I/O region 1C is filled with a stacked film including the high-k film HK and that metal film. Subsequently, polishing is performed using, for example, a CMP process to remove the excess high-k film HK and the excess metal film on the interlayer insulating film IL, so that the tops of the interlayer insulating film IL, the control gate electrode CG, and the memory gate electrode MG are exposed.

Consequently, in the logic region 1B, the gate insulating film GI2 including the high-k film HK embedded in the trench is formed, and the gate electrode G1 including the metal film, which is embedded in that trench with the gate insulating film GI2 in between, is formed. In the I/O region 1C, the gate insulating film GI3 including the high-k film HK formed in the above-described trench and the insulating film IF4 on the bottom of that trench is formed. In addition, the gate electrode G2, which includes the metal film embedded in the trench with the gate insulating film GI3 in between, is formed.

The gate electrode G1 and a pair of source-and-drain regions formed in the fin FB beside the gate electrode G1 configure the transistor Q1. The gate electrode G2 and a pair of source-and-drain regions formed in the fin FC beside the gate electrode G2 configure the transistor Q2. The transistor Q1 is a low-withstand-voltage MISFET that operates at a lower voltage than any of the first and second transistors in the memory cell region 1A and the transistor Q2 in the I/O region 1C, and has a metal gate electrode. The transistor Q2 is a high-withstand-voltage MISFET, and has a metal gate electrode.

A metal oxide film such as, for example, a hafnium oxide film, a zirconium oxide film, an aluminum oxide film, a tantalum oxide film, or a lanthanum oxide film may be used as the high-k film HK configuring the gate insulating films GI2 and GI3. That is, the gate insulating films GI2 and GI3 are each a high-dielectric-constant film having a higher dielectric constant than the silicon oxide film.

The metal film configuring the gate electrode G1 or G2 is configured by a two-layered, stacked film, for example. That stacked film includes a first metal film and a second metal film stacked in order from a semiconductor substrate SB side. The first metal film includes, for example, a titanium-aluminum (TiAl) film, and the second metal film includes, for example, an aluminum (Al) film. A titanium (Ti) film, a titanium nitride (TiN) film, or a stacked film thereof may be interposed between the first and second metal films to adjust the threshold voltage of the transistor Q1. In the drawing, the first and second metal films are shown as one metal film.

In the trench, the gate insulating film GI2 covers the bottom and the side surfaces of the gate electrode G1 and the bottom and the side surfaces of the trench. Similarly, in the trench, the gate insulating film GI3 covers the bottom and the side surfaces of the gate electrode G2 and the bottom and the side surfaces of the trench. When the insulating film IF6 is removed in the step described with reference to FIG. 26, oxidation treatment may be performed before formation of the gate insulating film GI2 so that a new insulating film is formed on the bottom of the trench and used as part of the gate insulating film. Although it has been described that the high-k film is formed after removal of the dummy gate electrode DG1 (see FIG. 25), that high-k film may be formed before formation of the polysilicon film SL2 (see FIG. 17)

configuring the dummy gate electrode DG1 and after the step described with reference to FIG. 16 so that the high-k film is left as the gate insulating film in the logic region 1B.

Figure 28:
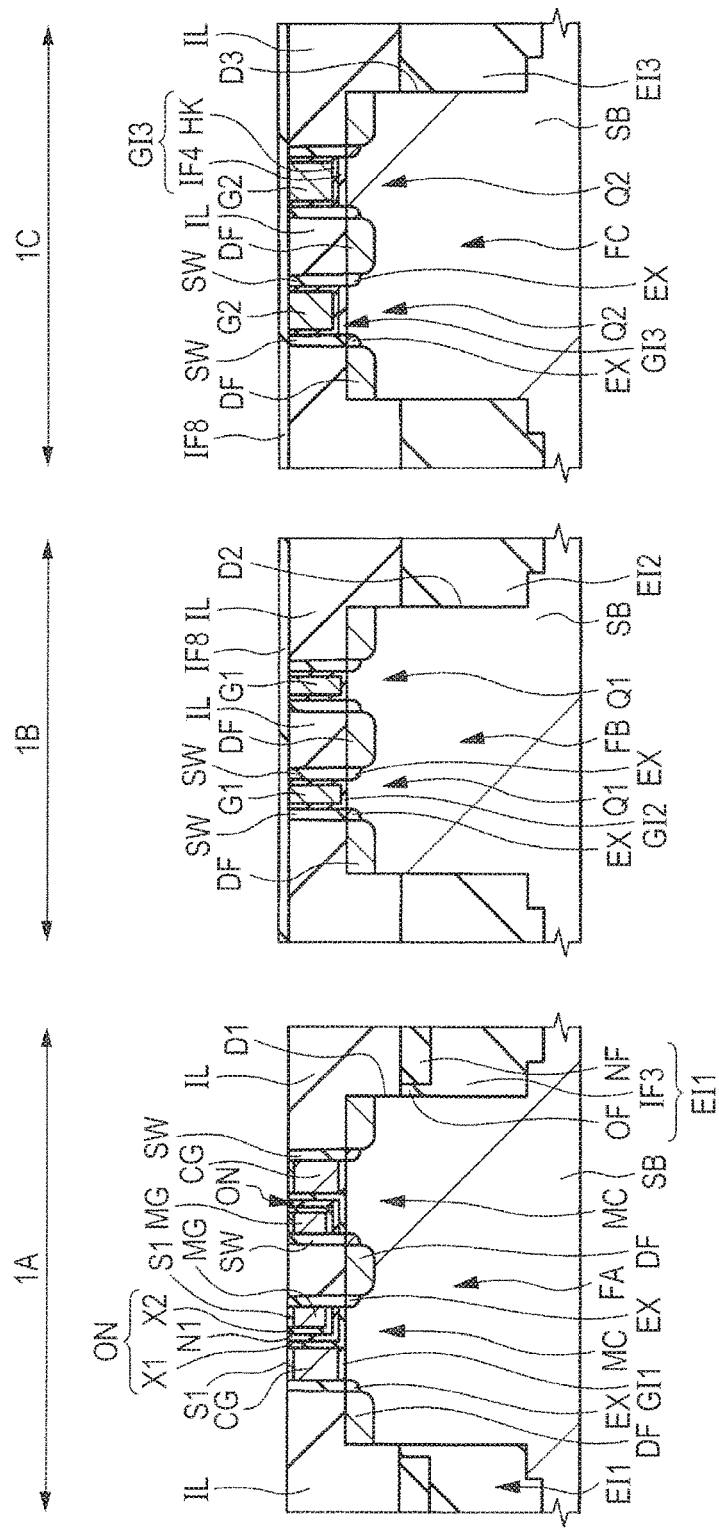
FIG. 28 includes sectional views explaining the manufacturing process of the semiconductor device following FIG. 27.

Subsequently, as shown in FIG. 28, the tops of the gate electrodes G1 and G2 are covered by the insulating film IF8, and then the silicide layer S1 is formed so as to cover the tops of the control gate electrode CG and the memory gate electrode MG.

The insulating film IF8 includes a silicon oxide film formed by a CVD process, for example. The insulating film IF8 is formed so as to cover the memory cell region 1A, the logic region 1B, and the I/O region 1C, and then patterning is performed to remove the insulating film IF8 in the memory cell region 1A. As a result, the insulating film IF8 remains so as to cover the tops of the interlayer insulating film IL, the sidewalls SW, and the gate electrodes G1 and G2 in the logic region 1B and the I/O region 1C. Subsequently, a metal film including a nickel (Ni) film or a cobalt (Co) film is formed on the exposed control gate electrode CG and memory gate electrode MG using, for example, a sputtering process, and then heat treatment is performed to react the metal film with each of the tops of the control gate electrode CG and the memory gate electrode MG.

Consequently, the silicide layer S1 including a nickel silicide (NiSi) layer or a cobalt silicide (CoSi) layer is formed so as to cover the tops of the control gate electrode CG and the memory gate electrode MG, and then the unreacted metal film is removed by wet etching or the like. Consequently, the element isolation region EI1 and the insulating film IF8 are exposed from that metal film. The insulating film IF8 covers the gate electrodes G1 and G2, which makes it possible to prevent the gate electrodes G1 and G2 as metal gate electrodes from being removed by that wet etching. The silicide layer is not formed over the gate electrodes G1 and G2.

Subsequently, while not shown, an interlayer insulating film is formed on the interlayer insulating film IL, and a plurality of contact plugs (connections) are formed so as to penetrate such interlayer insulating films and to be coupled to the control gate electrode CG, the memory gate electrode MG, the source-and-drain region, and the gate electrodes G1 and G2, thereby the semiconductor device of this embodiment is completed.

Specifically, an interlayer insulating film including a silicon oxide film or the like is formed on the interlayer insulating film IL using, for example, a CVD process, and then a plurality of contact holes are formed using a photolithography technique and a dry etching process so as to penetrate the stacked interlayer insulating film including the interlayer insulating film IL and the overlaid interlayer insulating film. The contact hole is an opening that exposes each of the tops of the diffusing layer DF configuring the source-and-drain region of the memory cell MC, the diffusing layer DF configuring the source-and-drain region of the transistor Q1, the control gate electrode CG, the memory gate electrode MG, the gate electrode G1, and the gate electrode G2. The top of the silicide layer S1 is exposed on the bottom of the contact hole directly over each of the control gate electrode CG and the memory gate electrode MG.

Subsequently, a metal film mainly including, for example, tungsten (W) is formed as a conductive film for coupling on the stacked interlayer insulating film using, for example, a sputtering process to completely fill the inside of each contact hole. In this embodiment, a barrier conductor film including, for example, a titanium film, a titanium nitride film, or a stacked film thereof is formed, and then a main conductor film including a tungsten film is formed on the barrier conductor film, thereby the metal film including the barrier conductor film and the main conductor film is formed. Subsequently, the unnecessary metal film on the stacked interlayer insulating film is removed by a CMP process or the like to form the contact plug embedded in each contact hole. The contact plug is electrically coupled to each of the control gate electrode CG, the memory gate electrode MG, the source-and-drain region, the gate electrode G1, and the gate electrode G2.

Figure 30:
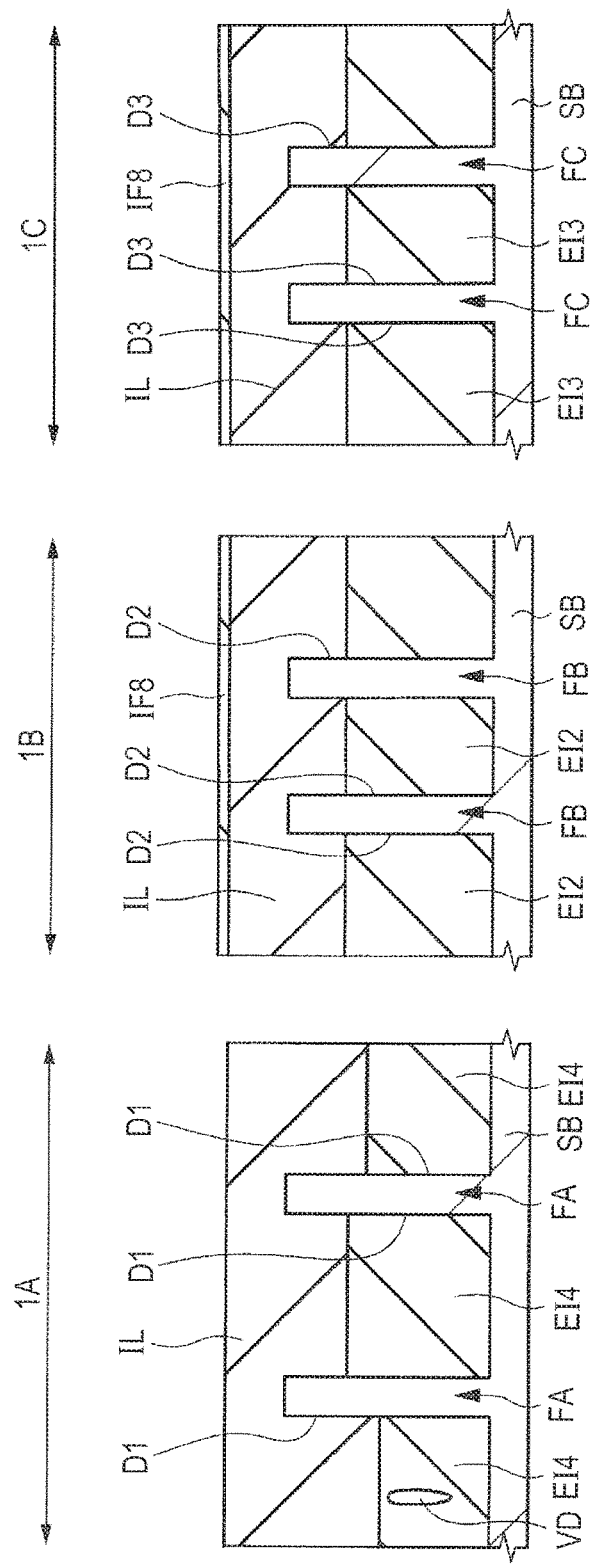
FIG. 30 includes sectional views illustrating a semiconductor device of a comparative example.

Effects of Semiconductor Device and of Method of Manufacturing the Semiconductor Device Effects of the semiconductor device and of the method of manufacturing the semiconductor device of this embodiment are described below with reference to FIG. 30 illustrating a comparative example. FIG. 30 includes sectional views illustrating a semiconductor device of the comparative example, which includes a memory cell including FINFET. FIG. 30 shows sections along a lateral direction of the fin in the memory cell region 1A, the logic region 1B, and the I/O region 1C in order from the left of the drawing.

The section of the memory cell region 1A shown in FIG. 30 is a section of a portion that corresponds to the section H-H in FIG. 4 and includes a source-and-drain region of a memory cell. In FIG. 30, the logic region 1B shows a section of a portion including a source-and-drain region of a low-withstand-voltage transistor, and the I/O region 1C shows a section of a portion including a source-and-drain region of a high-withstand-voltage transistor. However, such source-and-drain regions are omitted in the drawing. That is, each sectional view of FIG. 30 shows a section of a region in which the interlayer insulating film is formed over the element isolation region.

Although the gate electrode and the like are not shown in FIG. 30, the semiconductor device as a comparative example of FIG. 30 includes the MONOS memory cell formed in the memory cell region 1A, the low-withstand-voltage transistor formed in the logic region 1B, and the high-withstand-voltage transistor formed in the I/O region 1C. The semiconductor device of the comparative example includes an element isolation region EI4 that is embedded in the trench D1 and includes only a silicon oxide film, and is thus different from the semiconductor device of the above-described embodiment in that no silicon nitride film is provided in the element isolation region EI4. In other words, the top of the element isolation region EI4 is entirely configured by the silicon oxide film. Other configurations of the semiconductor device of the comparative example are the same as those of the semiconductor device of this embodiment.

Although part of the element isolation region EI4 shown in FIG. 30 internally has a void VD, the void VD may also exist in the insulating film IF3 (see FIG. 2) configuring the element isolation region EI1 of the semiconductor device of this embodiment. A recess (STI recess) may be formed in the top of the element isolation region EI4 directly above the void VD.

As the memory cell becomes finer, current driving force is disadvantageously reduced along with a reduction in channel width. With regard to this, a semiconductor device including a memory cell, which has a convex active region and includes a control gate electrode and a memory gate electrode that are disposed so as to straddle a convex protrusion, is formed, making it possible to provide a large effective channel width even in a fined layout, leading to a high current driving force. Hence, a memory cell having the fin structure is advantageous in light of fining the semiconductor device.

In light of fining the semiconductor device, it is required to reduce an interval between adjacent fins and form a deep trench between adjacent fins. When that trench is deeper, a height from the top of the element isolation region embedded in the trench to the top of the fin is accordingly larger, which also increases a height of a pattern of the gate electrode or the like formed over the element isolation region in the trench; hence, a high processing technique is required to form that pattern over the element isolation region. For the semiconductor device having the fin structure, therefore, it is necessary to accurately form the top of the element isolation region at a desired height to prevent variations in height of the top of the element isolation region in each region.

FIG. 30 shows a structure in the case where the height of the top of the element isolation region EI4 varies in the memory cell region 1A. A position of the top of the element isolation region EI4 may thus fluctuate in a step (fin formation step) after the fin FA is exposed above the element isolation region EI4, causing variations in that position. This increases a load in each step after the fin formation step, and makes it difficult to stably form a MONOS memory having desired characteristics. An increase in the load in each step after the fin formation step means an increase in difficulty in processing in a step of processing each of the control gate electrode CG, the memory gate electrode MG, and the sidewalls adjacent to such gate electrodes, and means an increase in difficulty in filling the inside of the trench over the element isolation region EI4 with the interlayer insulating film IL.

Specifically, when the position of the top of the element isolation region EI4 varies, defective processing of the gate electrode or the sidewall may occur in the memory cell region 1A, and insufficient filling may occur during filling of the inside of the trench D1 with the interlayer insulating film IL. Consequently, reliability of the semiconductor device is disadvantageously reduced.

In the MONOS memory having the fin structure, height of the fin FA, i.e., height of the fin FA adjacent to the gate electrode is reduced by the thickness of the ONO film. Hence, the fin may be formed higher than the element in each of the logic region 1B and the I/O region 1C in order to produce the MONOS memory having desired characteristics. This means a large depth of the trench over the element isolation region EI4, the depth having the same size as the height of the fin exposed above the element isolation region EI4. It is therefore important to suppress variations in the position of the top of the element isolation region EI4 in the memory cell region 1A than in each of the logic region 1B and the I/O region 1C.

In the memory cell region 1A in which the split-gate MONOS memory is formed, however, the etching step and the cleaning step are performed many times while the element isolation region EI4 is exposed, and thus it is difficult to fix the top of the element isolation region EI4, which includes a silicon oxide film that is easily shaved in such steps, at a desired position. Specifically, for example, the top of the element isolation region EI4 is subjected to etching and a cleaning liquid in the etching step and the cleaning step performed to form the control gate electrode CG and the gate insulating film GI1 as described with reference to FIG. 18. Similarly, the top of the element isolation region EI4 is subjected to etching and a cleaning liquid in the etching step and the cleaning step for removal of the ONO film ON performed to form the memory gate electrode MG as described with reference to FIG. 21, and in the etching step and the cleaning step performed to form the sidewall SW as described with reference to FIG. 23.

On the other hand, the tops of the element isolation regions EI2 and EI3 in the logic region 1B and the I/O region 1C are considered to be subjected to etching and a cleaning liquid during formation of the gate electrode (dummy gate electrode), during formation of the sidewall SW, and the like. However, the number of times the element isolation regions EI2 and EI3 are each subjected to the etching and the cleaning liquid is small compared with the element isolation region EI4 in the memory cell region 1A. In this way, since there are many processing steps and many cleaning steps in the memory cell region 1A, variations easily occur in the top of the element isolation region EI4 including only the silicon oxide film.

When an interval between the fins is small, the void VD may be formed within the element isolation region EI4 as shown in FIG. 30. In such a case, since the element isolation region EI4 directly above the void VD is naturally easily shaved by etching and cleaning, variations more easily occur in the top of the element isolation region EI4. The STI recess formed in the top of the element isolation region EI4 directly above the void VD may be a source of a foreign substance. Production of such a foreign substance causes a reduction in reliability of the semiconductor device.

In this embodiment, therefore, the top of the element isolation region EI1 as shown in FIG. 2 is protected by the silicon nitride film NF. Specifically, the top of the element isolation region EI1 is configured by the silicon nitride film NF, which makes it possible to prevent the top of the element isolation region EI1 from being shaved and thus prevent the position of the top of the element isolation region EI1 from varying in the etching step and the cleaning step after formation of the element isolation region EI1. This is because silicon nitride configuring the silicon nitride film NF is a material that has a higher density than silicon oxide configuring the insulating film IF3 and the element isolation regions EI2 and EI3, and thus has a higher resistance against etching and cleaning.

As described above, most of the top of the element isolation region EI1 is configured by the silicon nitride film NF, which makes it possible to suppress variations in the top of the element isolation region EI1, and thus reduce variations in irregularities of the top of the element isolation region EI1. In addition, even if the void VD (see FIG. 30) is formed within the insulating film IF3 configuring the element isolation region EI1, and even if the STI recess is formed in the top of the insulating film IF3 directly above the void VD, since the top of the insulating film IF3 is covered with the silicon nitride film NF in this embodiment, a foreign substance can be prevented from being produced from the STI recess.

Since characteristics of the MONOS memory are greatly affected by a size of a channel width, i.e., height of the fin protruding above the element isolation region EI1, variations in the position of the top of the element isolation region EI1 mean variations in characteristics of the memory cell MC. With regard to this, since the variations in the position of the top of the element isolation region EI1 can be suppressed herein, the characteristics of the memory cell MC can be prevented from varying. In addition, since the top of the element isolation region EI1 can be accurately formed at a desired position, the load in each step after the formation step of the fin FA can be reduced. That is, it is possible to prevent defective processing of the control gate electrode CG or the sidewall SW, and prevent insufficient filling of the inside of the trench D1 with the interlayer insulating film IL. Consequently, a production yield can be improved. In this way, reliability of the semiconductor device can be improved in this embodiment.

In the logic region 1B and the I/O region 1C other than the memory cell region 1A, each of the tops of the element isolation regions EI2 and EI3 is configured only by a silicon oxide film while the top of each region is not configured by a silicon nitride film. One reason for this is that internal stress of that silicon nitride film may affect the characteristics of each of the transistors Q1 and Q2. Another reason is that since there are small number of etching steps and a small number of cleaning steps in the formation step of each of the transistors Q1 and Q2 compared with the formation step of the memory cell MC, the tops of the element isolation regions EI2 and EI3 are less likely to be shaved, and thus it is less necessary to protect the tops of the element isolation regions compared with the memory cell region 1A.

In the one embodiment, the element isolation region EI1 in the memory cell region 1A is not entirely configured by a silicon nitride film, and only the upper-layer portion of the element isolation region EI1 is configured by the silicon nitride film NF, so that the element isolation region EI1 has a stacked structure of the insulating film IF3 and the silicon nitride film NF, which prevents stress generation in the memory cell region 1A. The thickness of the silicon nitride film NF is limited within the range from 5 to 15 nm herein, which prevents variations in the position of the top of the element isolation region EI1, and prevents stress generation in the memory cell region 1A.

Although the invention achieved by the inventors has been described in detail according to one embodiment thereof hereinbefore, the invention should not be limited thereto, and it will be appreciated that various modifications or alterations thereof may be made within the scope without departing from the gist of the invention.

What is claimed is:

1. A semiconductor device, comprising:
    a semiconductor substrate having a first region and a second region arranged along a main surface of the semiconductor substrate;
    a plurality of first protrusions that are a part of the semiconductor substrate in the first region, protrude from a top of the semiconductor substrate, and extend in a first direction along the main surface of the semiconductor substrate;
    a first element isolation region embedded in a first trench between the first protrusions adjacent to each other;
    a first gate electrode that is formed over tops of the first protrusions with a first insulating film in between, and extends in a second direction orthogonal to the first direction;
    a second gate electrode that is formed over tops of the first protrusions with a second insulating film including a charge storage part in between, and extends in the second direction alongside the first gate electrode;
    a first source-and-drain region formed in each of the tops of the first protrusions;
    a plurality of second protrusions that are a part of the semiconductor substrate in the second region, protrude from the top of the semiconductor substrate, and extend in the first direction;
    a second element isolation region embedded in a second trench between the second protrusions adjacent to each other,
    a transistor including a third gate electrode that is formed over the tops of the second protrusions with a third insulating film in between and extends in the second direction, and a second source-and-drain region formed in each of the tops of the second protrusions,
    wherein the first gate electrode and the second gate electrode extend directly over the first element isolation region,
    wherein the first gate electrode, the second gate electrode, and the first source-and-drain region configure a non-volatile memory element; and
    wherein a top of the first element isolation region is configured by a top of a silicon nitride film and a top surface of a first silicon oxide film, and
    wherein a top of the second element isolation region is configured entirely by a top of a second silicon oxide film.

2. The semiconductor device according to claim 1, wherein the first element isolation region includes:
    a third silicon oxide film embedded in the first trench; and
    the silicon nitride film formed over the third silicon oxide film.

3. The semiconductor device according to claim 1, wherein the first element isolation region further includes the first silicon oxide film formed between each of the first protrusions and the silicon nitride film.

4. The semiconductor device according to claim 3, wherein the top of the first element isolation region includes the top of the silicon nitride film and the top surface of the first silicon oxide film, and an area of the top of the silicon nitride film is larger than an area of the top surface of the first silicon oxide film.

5. The semiconductor device according to claim 1, wherein the silicon nitride film has a thickness of 5 nm to 15 nm.

6. The semiconductor device according to claim 1, further comprising a sidewall including a fourth insulating film that covers side surfaces on both sides of a pattern including the first gate electrode and the second gate electrode, and extends in the second direction.

* * * * *